US012749523B2

(12) United States Patent
He et al.

(10) Patent No.: US 12,749,523 B2
(45) Date of Patent: Sep. 29, 2026

(54) APPARATUSES AND METHODS FOR ACCESS BASED TARGETED REFRESH OPERATIONS

(71) Applicant: MICRON TECHNOLOGY, INC., Boise, ID (US)

(72) Inventors: Yuan He, Boise, ID (US); Takamasa Suzuki, Tokyo (JP)

(73) Assignee: Micron Technology, Inc., Boise, ID (US)

(*) Notice: Subject to any disclaimer, the term of this patent is extended or adjusted under 35 U.S.C. 154(b) by 127 days.

(21) Appl. No.: 18/829,734

(22) Filed: Sep. 10, 2024

(65) Prior Publication Data

US 2025/0006243 A1 Jan. 2, 2025

Related U.S. Application Data

(62) Division of application No. 17/731,645, filed on Apr. 28, 2022, now Pat. No. 12,112,787.

(51) Int. Cl.
*G11C 11/406* (2006.01)
*G11C 11/408* (2006.01)

(52) U.S. Cl.
CPC .. *G11C 11/40622* (2013.01); *G11C 11/40615* (2013.01); *G11C 11/4085* (2013.01)

(58) Field of Classification Search
CPC ........................ G11C 11/40622; G11C 11/406
USPC .......................................................... 365/222
See application file for complete search history.

(56) References Cited

U.S. PATENT DOCUMENTS

| | | | |
|---|---|---|---|
| 5,225,839 | A | 7/1993 | Okurowski et al. |
| 5,299,159 | A | 3/1994 | Balistreri et al. |
| 5,654,929 | A | 8/1997 | Mote |
| 5,699,297 | A | 12/1997 | Yamazaki et al. |
| 5,867,442 | A | 2/1999 | Kim et al. |
| 5,933,377 | A | 8/1999 | Hidaka |
| 5,943,283 | A | 8/1999 | Wong et al. |
| 5,956,288 | A | 9/1999 | Bermingham et al. |
| 5,959,923 | A | 9/1999 | Matteson et al. |
| 5,970,507 | A | 10/1999 | Kato et al. |
| 5,999,471 | A | 12/1999 | Choi |
| 5,999,473 | A | 12/1999 | Harrington et al. |
| 6,002,629 | A | 12/1999 | Kim et al. |
| 6,011,734 | A | 1/2000 | Pappert |

(Continued)

FOREIGN PATENT DOCUMENTS

| | | | |
|---|---|---|---|
| BE | 825677 | A | 8/1975 |
| CN | 1841551 | A | 10/2006 |

(Continued)

OTHER PUBLICATIONS

PCT Application No. PCT/US20/23689, titled "Semiconductor Device Having Cam That Stores Address Signals", dated Mar. 19, 2020.

(Continued)

*Primary Examiner* — Muna A Techane
(74) *Attorney, Agent, or Firm* — Dorsey & Whitney LLP

(57) ABSTRACT

Apparatuses, systems, and methods for access based targeted refresh operations. A memory bank has a first sub-bank and a second sub-bank. A refresh control circuit detects an aggressor in one of the sub-banks. Responsive to an access in the other sub-bank, the refresh control circuit performs a targeted refresh operation based on the sub-bank based on the aggressor address.

20 Claims, 7 Drawing Sheets

(56) References Cited

U.S. PATENT DOCUMENTS

| | | | |
|---|---|---|---|
| 6,061,290 | A | 5/2000 | Shirley |
| 6,064,621 | A | 5/2000 | Tanizaki et al. |
| 6,212,118 | B1 | 4/2001 | Fujita |
| 6,298,413 | B1 | 10/2001 | Christenson |
| 6,306,721 | B1 | 10/2001 | Teo et al. |
| 6,310,806 | B1 | 10/2001 | Higashi et al. |
| 6,310,814 | B1 | 10/2001 | Hampel et al. |
| 6,363,024 | B1 | 3/2002 | Fibranz |
| 6,392,952 | B1 | 5/2002 | Chen et al. |
| 6,424,582 | B1 | 7/2002 | Ooishi |
| 6,434,064 | B2 | 8/2002 | Nagai |
| 6,452,868 | B1 | 9/2002 | Fister |
| 6,490,216 | B1 | 12/2002 | Chen et al. |
| 6,515,928 | B2 | 2/2003 | Sato et al. |
| 6,535,950 | B1 | 3/2003 | Funyu et al. |
| 6,535,980 | B1 | 3/2003 | Kumar et al. |
| 6,563,757 | B2 | 5/2003 | Agata |
| 6,567,340 | B1 | 5/2003 | Nataraj et al. |
| 6,950,364 | B2 | 9/2005 | Kim |
| 6,977,824 | B1 | 12/2005 | Yang et al. |
| 7,002,868 | B2 | 2/2006 | Takahashi |
| 7,057,960 | B1 | 6/2006 | Fiscus et al. |
| 7,061,225 | B2 | 6/2006 | Yang et al. |
| 7,061,780 | B2 | 6/2006 | Yang et al. |
| 7,082,070 | B2 | 7/2006 | Hong |
| 7,187,607 | B2 | 3/2007 | Koshikawa et al. |
| 7,203,113 | B2 | 4/2007 | Takahashi et al. |
| 7,203,115 | B2 | 4/2007 | Eto et al. |
| 7,209,402 | B2 | 4/2007 | Shinozaki et al. |
| 7,215,588 | B2 | 5/2007 | Lee |
| 7,444,577 | B2 | 10/2008 | Best et al. |
| 7,551,502 | B2 | 6/2009 | Dono et al. |
| 7,565,479 | B2 | 7/2009 | Best et al. |
| 7,692,993 | B2 | 4/2010 | Iida et al. |
| 7,830,742 | B2 | 11/2010 | Han |
| 8,174,921 | B2 | 5/2012 | Kim et al. |
| 8,400,805 | B2 | 3/2013 | Yoko |
| 8,526,260 | B2 | 9/2013 | Pyeon |
| 8,572,423 | B1 | 10/2013 | Isachar et al. |
| 8,625,360 | B2 | 1/2014 | Iwamoto et al. |
| 8,681,578 | B2 | 3/2014 | Narui |
| 8,756,368 | B2 | 6/2014 | Best et al. |
| 8,811,100 | B2 | 8/2014 | Ku |
| 8,862,973 | B2 | 10/2014 | Zimmerman et al. |
| 8,938,573 | B2 | 1/2015 | Greenfield et al. |
| 9,032,141 | B2 | 5/2015 | Bains et al. |
| 9,047,978 | B2 | 6/2015 | Bell et al. |
| 9,076,499 | B2 | 7/2015 | Schoenborn et al. |
| 9,076,548 | B1 | 7/2015 | Park et al. |
| 9,087,602 | B2 | 7/2015 | Youn et al. |
| 9,117,544 | B2 | 8/2015 | Bains et al. |
| 9,123,447 | B2 | 9/2015 | Lee et al. |
| 9,153,294 | B2 | 10/2015 | Kang |
| 9,190,137 | B2 | 11/2015 | Kim et al. |
| 9,190,139 | B2 | 11/2015 | Jung et al. |
| 9,236,110 | B2 | 1/2016 | Bains et al. |
| 9,251,885 | B2 | 2/2016 | Greenfield et al. |
| 9,286,964 | B2 | 3/2016 | Halbert et al. |
| 9,299,400 | B2 | 3/2016 | Bains et al. |
| 9,311,984 | B1 | 4/2016 | Hong et al. |
| 9,311,985 | B2 | 4/2016 | Lee et al. |
| 9,324,398 | B2 | 4/2016 | Jones et al. |
| 9,384,821 | B2 | 7/2016 | Bains et al. |
| 9,390,782 | B2 | 7/2016 | Best et al. |
| 9,396,786 | B2 | 7/2016 | Yoon et al. |
| 9,406,358 | B1 | 8/2016 | Lee |
| 9,412,432 | B2 | 8/2016 | Narui et al. |
| 9,418,723 | B2 | 8/2016 | Chishti et al. |
| 9,424,907 | B2 | 8/2016 | Fujishiro |
| 9,478,316 | B1 | 10/2016 | Ryu |
| 9,484,079 | B2 | 11/2016 | Lee |
| 9,514,850 | B2 | 12/2016 | Kim |
| 9,570,143 | B2 | 2/2017 | Lim et al. |
| 9,570,201 | B2 | 2/2017 | Morgan et al. |
| 9,640,242 | B1 | 5/2017 | Lo et al. |
| 9,646,672 | B1 | 5/2017 | Kim et al. |
| 9,653,139 | B1 | 5/2017 | Park |
| 9,672,889 | B2 | 6/2017 | Lee et al. |
| 9,685,240 | B1 | 6/2017 | Park |
| 9,691,466 | B1 | 6/2017 | Kim |
| 9,697,913 | B1 | 7/2017 | Mariani et al. |
| 9,734,887 | B1 | 8/2017 | Tavva |
| 9,741,409 | B2 | 8/2017 | Jones et al. |
| 9,741,421 | B1 | 8/2017 | Hedden |
| 9,741,447 | B2 | 8/2017 | Akamatsu |
| 9,747,971 | B2 | 8/2017 | Bains et al. |
| 9,761,297 | B1 | 9/2017 | Tomishima |
| 9,786,351 | B2 | 10/2017 | Lee et al. |
| 9,799,391 | B1 | 10/2017 | Wei |
| 9,805,782 | B1 | 10/2017 | Liou |
| 9,805,783 | B2 | 10/2017 | Ito et al. |
| 9,812,185 | B2 | 11/2017 | Fisch et al. |
| 9,818,469 | B1 | 11/2017 | Kim et al. |
| 9,831,003 | B2 | 11/2017 | Sohn et al. |
| 9,865,326 | B2 | 1/2018 | Bains et al. |
| 9,865,328 | B1 | 1/2018 | Desimone et al. |
| 9,892,779 | B2 | 2/2018 | Kang et al. |
| 9,922,694 | B2 | 3/2018 | Akamatsu |
| 9,928,896 | B1 | 3/2018 | Kim et al. |
| 9,934,143 | B2 | 4/2018 | Bains et al. |
| 9,953,696 | B2 | 4/2018 | Kim |
| 9,972,377 | B2 | 5/2018 | Oh et al. |
| 9,978,430 | B2 | 5/2018 | Seo et al. |
| 10,003,328 | B1 | 6/2018 | Yin et al. |
| 10,020,045 | B2 | 7/2018 | Riho |
| 10,020,046 | B1 | 7/2018 | Uemura |
| 10,032,501 | B2 | 7/2018 | Ito et al. |
| 10,049,716 | B2 | 8/2018 | Proebsting |
| 10,083,737 | B2 | 9/2018 | Bains et al. |
| 10,090,038 | B2 | 10/2018 | Shin |
| 10,134,461 | B2 | 11/2018 | Bell et al. |
| 10,141,042 | B1 | 11/2018 | Richter |
| 10,147,472 | B2 | 12/2018 | Jones et al. |
| 10,153,031 | B2 | 12/2018 | Akamatsu |
| 10,170,174 | B1 | 1/2019 | Ito et al. |
| 10,192,608 | B2 | 1/2019 | Morgan |
| 10,210,925 | B2 | 2/2019 | Bains et al. |
| 10,297,305 | B1 | 5/2019 | Moon et al. |
| 10,297,307 | B1 | 5/2019 | Raad et al. |
| 10,339,994 | B2 | 7/2019 | Ito et al. |
| 10,381,327 | B2 | 8/2019 | Ramachandra et al. |
| 10,418,978 | B1 | 9/2019 | Au Yeung et al. |
| 10,446,256 | B2 | 10/2019 | Ong et al. |
| 10,468,076 | B1 | 11/2019 | He et al. |
| 10,490,250 | B1 | 11/2019 | Ito et al. |
| 10,490,251 | B2 | 11/2019 | Wolff |
| 10,504,577 | B1 | 12/2019 | Alzheimer |
| 10,510,396 | B1 | 12/2019 | Notani et al. |
| 10,572,377 | B1 | 2/2020 | Zhang et al. |
| 10,573,370 | B2 | 2/2020 | Ito et al. |
| 10,607,679 | B2 | 3/2020 | Nakaoka |
| 10,672,449 | B2 | 6/2020 | Ito et al. |
| 10,685,696 | B2 | 6/2020 | Brown et al. |
| 10,699,796 | B2 | 6/2020 | Benedict et al. |
| 10,790,005 | B1 | 9/2020 | He et al. |
| 10,825,505 | B2 | 11/2020 | Rehmeyer |
| 10,832,792 | B1 | 11/2020 | Penney et al. |
| 10,930,335 | B2 | 2/2021 | Bell et al. |
| 10,943,636 | B1 | 3/2021 | Wu et al. |
| 10,950,289 | B2 | 3/2021 | Ito et al. |
| 10,957,377 | B2 | 3/2021 | Noguchi |
| 10,964,378 | B2 | 3/2021 | Ayyapureddi et al. |
| 10,978,132 | B2 | 4/2021 | Rehmeyer et al. |
| 11,017,833 | B2 | 5/2021 | Wu et al. |
| 11,062,754 | B2 | 7/2021 | Ito et al. |
| 11,069,393 | B2 | 7/2021 | Cowles et al. |
| 11,081,160 | B2 | 8/2021 | Ito et al. |
| 11,222,683 | B2 * | 1/2022 | Rehmeyer ............ G11C 29/702 |
| 11,222,686 | B1 | 1/2022 | Noguchi |
| 11,227,649 | B2 | 1/2022 | Meier et al. |
| 11,264,079 | B1 | 3/2022 | Roberts |
| 11,302,374 | B2 | 4/2022 | Jenkinson et al. |
| 11,302,377 | B2 | 4/2022 | Li et al. |
| 11,309,010 | B2 | 4/2022 | Ayyapureddi |

(56) References Cited

U.S. PATENT DOCUMENTS 11,309,012 B2 4/2022 Meier et al.
11,315,619 B2 4/2022 Wolff
11,315,620 B2 4/2022 Ishikawa et al.
11,320,377 B2 5/2022 Chen et al.
11,348,631 B2 5/2022 Wu et al.
11,380,382 B2 7/2022 Zhang et al.
11,386,946 B2 * 7/2022 Ayyapureddi .... G11C 11/40622
11,417,383 B2 8/2022 Jenkinson et al.
11,532,346 B2 12/2022 Brown et al.
11,557,331 B2 1/2023 Mitsubori et al.
11,610,622 B2 3/2023 Rehmeyer et al.
11,615,831 B2 3/2023 Yamamoto
11,626,152 B2 4/2023 Wu et al.
11,688,452 B2 6/2023 Nale et al.
11,715,512 B2 8/2023 Li et al.
11,749,331 B2 9/2023 Wu et al.
11,798,610 B2 10/2023 Cowles et al.
11,810,612 B2 11/2023 Roberts
11,935,576 B2 3/2024 Ishikawa et al.
11,955,158 B2 4/2024 Brown et al.
12,112,787 B2 10/2024 He et al.
12,125,514 B2 10/2024 Suzuki
2001/0008498 A1 7/2001 Ooishi
2002/0026613 A1 2/2002 Niiro
2002/0181301 A1 12/2002 Takahashi et al.
2002/0191467 A1 12/2002 Matsumoto et al.
2003/0026161 A1 2/2003 Yamaguchi et al.
2003/0063512 A1 4/2003 Takahashi et al.
2003/0067825 A1 4/2003 Shimano et al.
2003/0081483 A1 5/2003 De et al.
2003/0123301 A1 7/2003 Jang et al.
2003/0161208 A1 8/2003 Nakashima et al.
2003/0193829 A1 10/2003 Morgan et al.
2003/0231540 A1 12/2003 Lazar et al.
2004/0004856 A1 1/2004 Sakimura et al.
2004/0008544 A1 1/2004 Shinozaki et al.
2004/0022093 A1 2/2004 Lee
2004/0024955 A1 2/2004 Patel
2004/0085835 A1 5/2004 Ahn et al.
2004/0114446 A1 6/2004 Takahashi et al.
2004/0130959 A1 7/2004 Kawaguchi
2004/0160838 A1 8/2004 Pelley et al.
2004/0184323 A1 9/2004 Mori et al.
2004/0218431 A1 11/2004 Chung et al.
2005/0002254 A1 1/2005 Otsuka et al.
2005/0002268 A1 1/2005 Otsuka et al.
2005/0041502 A1 2/2005 Perner
2005/0105362 A1 5/2005 Choi et al.
2005/0108460 A1 5/2005 David
2005/0213408 A1 9/2005 Shieh
2005/0243627 A1 11/2005 Lee et al.
2005/0249009 A1 11/2005 Shieh
2005/0265104 A1 12/2005 Remaklus et al.
2006/0018174 A1 1/2006 Park et al.
2006/0050591 A1 3/2006 Park
2006/0083099 A1 4/2006 Bae et al.
2006/0087903 A1 4/2006 Riho et al.
2006/0104139 A1 5/2006 Hur et al.
2006/0176744 A1 8/2006 Stave
2006/0198220 A1 9/2006 Yoon et al.
2006/0215474 A1 9/2006 Hokenmaier
2006/0233012 A1 10/2006 Sekiguchi et al.
2006/0262616 A1 11/2006 Chen
2006/0262617 A1 11/2006 Lee
2006/0268643 A1 11/2006 Schreck et al.
2007/0002651 A1 1/2007 Lee
2007/0008799 A1 1/2007 Dono et al.
2007/0014175 A1 1/2007 Min et al.
2007/0028068 A1 2/2007 Golding et al.
2007/0030746 A1 2/2007 Best et al.
2007/0033338 A1 2/2007 Tsern
2007/0033339 A1 2/2007 Best et al.
2007/0058462 A1 3/2007 Blodgett
2007/0106838 A1 5/2007 Choi
2007/0147154 A1 6/2007 Lee
2007/0165042 A1 7/2007 Yagi
2007/0171750 A1 7/2007 Oh
2007/0237016 A1 10/2007 Miyamoto et al.
2007/0263442 A1 11/2007 Cornwell et al.
2007/0268768 A1 11/2007 Kawakubo
2007/0297252 A1 12/2007 Singh
2008/0028137 A1 1/2008 Schakel et al.
2008/0028260 A1 1/2008 Oyagi et al.
2008/0031068 A1 2/2008 Yoo et al.
2008/0126893 A1 5/2008 Harrand et al.
2008/0130394 A1 6/2008 Dono et al.
2008/0181048 A1 7/2008 Han
2008/0212386 A1 9/2008 Riho
2008/0224742 A1 9/2008 Pomichter
2008/0253212 A1 10/2008 Iida et al.
2008/0253213 A1 10/2008 Sato et al.
2008/0266990 A1 10/2008 Loeffler
2008/0270683 A1 10/2008 Barth et al.
2008/0306723 A1 12/2008 De et al.
2008/0316845 A1 12/2008 Wang et al.
2009/0021999 A1 1/2009 Tanimura et al.
2009/0052264 A1 2/2009 Hong et al.
2009/0059641 A1 3/2009 Jeddeloh
2009/0073760 A1 3/2009 Betser et al.
2009/0147606 A1 6/2009 Daniel
2009/0161468 A1 6/2009 Fujioka
2009/0168571 A1 7/2009 Pyo et al.
2009/0185440 A1 7/2009 Lee
2009/0201752 A1 8/2009 Riho et al.
2009/0228739 A1 9/2009 Cohen et al.
2009/0251971 A1 10/2009 Futatsuyama
2009/0296510 A1 12/2009 Lee et al.
2010/0005217 A1 1/2010 Jeddeloh
2010/0005376 A1 1/2010 Laberge et al.
2010/0061153 A1 3/2010 Yen et al.
2010/0074042 A1 3/2010 Fukuda et al.
2010/0097870 A1 4/2010 Kim et al.
2010/0110809 A1 5/2010 Kobayashi et al.
2010/0110810 A1 5/2010 Kobayashi
2010/0124138 A1 5/2010 Lee et al.
2010/0128547 A1 5/2010 Kagami
2010/0131812 A1 5/2010 Mohammad
2010/0141309 A1 6/2010 Lee
2010/0157693 A1 6/2010 Iwai et al.
2010/0182862 A1 7/2010 Teramoto
2010/0182863 A1 7/2010 Fukiage
2010/0329069 A1 12/2010 Ito et al.
2011/0007592 A1 1/2011 Tashiro
2011/0026290 A1 2/2011 Noda et al.
2011/0055495 A1 3/2011 Remaklus et al.
2011/0069572 A1 3/2011 Lee et al.
2011/0122987 A1 5/2011 Neyer
2011/0134715 A1 6/2011 Norman
2011/0170353 A1 7/2011 Nguyen
2011/0216614 A1 9/2011 Hosoe
2011/0225355 A1 9/2011 Kajigaya
2011/0299352 A1 12/2011 Fujishiro et al.
2011/0310648 A1 12/2011 Iwamoto et al.
2012/0014199 A1 1/2012 Narui
2012/0059984 A1 3/2012 Kang et al.
2012/0151131 A1 6/2012 Kilmer et al.
2012/0155173 A1 6/2012 Lee et al.
2012/0155206 A1 6/2012 Kodama et al.
2012/0213021 A1 8/2012 Riho et al.
2012/0254472 A1 10/2012 Ware et al.
2012/0287727 A1 11/2012 Wang
2012/0307582 A1 12/2012 Marumoto et al.
2012/0327734 A1 12/2012 Sato
2013/0003467 A1 1/2013 Klein
2013/0003477 A1 1/2013 Park et al.
2013/0028034 A1 1/2013 Fujisawa
2013/0051157 A1 2/2013 Park
2013/0051171 A1 2/2013 Porter et al.
2013/0077423 A1 3/2013 Lee
2013/0173971 A1 7/2013 Zimmerman
2013/0254475 A1 9/2013 Perego et al.
2013/0279284 A1 10/2013 Jeong
2013/0304982 A1 11/2013 Jung et al.
2014/0006700 A1 1/2014 Schaefer et al.

(56) References Cited

U.S. PATENT DOCUMENTS

| | | | |
|---|---|---|---|
| 2014/0006703 | A1 | 1/2014 | Bains et al. |
| 2014/0006704 | A1 | 1/2014 | Greenfield et al. |
| 2014/0013169 | A1 | 1/2014 | Kobla et al. |
| 2014/0013185 | A1 | 1/2014 | Kobla et al. |
| 2014/0016422 | A1 | 1/2014 | Kim et al. |
| 2014/0022858 | A1 | 1/2014 | Chen et al. |
| 2014/0043888 | A1 | 2/2014 | Chen et al. |
| 2014/0050004 | A1 | 2/2014 | Mochida |
| 2014/0078841 | A1 | 3/2014 | Chopra |
| 2014/0078842 | A1 | 3/2014 | Oh et al. |
| 2014/0089576 | A1 | 3/2014 | Bains et al. |
| 2014/0089758 | A1 | 3/2014 | Kwok et al. |
| 2014/0095780 | A1 | 4/2014 | Bains et al. |
| 2014/0095786 | A1 | 4/2014 | Moon et al. |
| 2014/0119091 | A1 | 5/2014 | You et al. |
| 2014/0143473 | A1 | 5/2014 | Kim et al. |
| 2014/0153315 | A1 | 6/2014 | Kwon et al. |
| 2014/0156923 | A1 | 6/2014 | Bains et al. |
| 2014/0169114 | A1 | 6/2014 | Oh |
| 2014/0177370 | A1 | 6/2014 | Halbert et al. |
| 2014/0181453 | A1 | 6/2014 | Jayasena et al. |
| 2014/0185403 | A1 | 7/2014 | Lai |
| 2014/0189228 | A1 | 7/2014 | Greenfield et al. |
| 2014/0219042 | A1 | 8/2014 | Yu et al. |
| 2014/0219043 | A1 | 8/2014 | Jones et al. |
| 2014/0237307 | A1 | 8/2014 | Kobla et al. |
| 2014/0241099 | A1 | 8/2014 | Seo et al. |
| 2014/0254298 | A1 | 9/2014 | Dally |
| 2014/0281206 | A1 | 9/2014 | Crawford et al. |
| 2014/0281207 | A1 | 9/2014 | Mandava et al. |
| 2014/0293725 | A1 | 10/2014 | Best et al. |
| 2014/0321226 | A1 | 10/2014 | Pyeon |
| 2015/0016203 | A1 | 1/2015 | Sriramagiri et al. |
| 2015/0036445 | A1 | 2/2015 | Yoshida et al. |
| 2015/0049566 | A1 | 2/2015 | Lee et al. |
| 2015/0049567 | A1 | 2/2015 | Chi |
| 2015/0055420 | A1 | 2/2015 | Bell et al. |
| 2015/0078112 | A1 | 3/2015 | Huang |
| 2015/0085564 | A1 | 3/2015 | Yoon et al. |
| 2015/0089326 | A1 | 3/2015 | Joo et al. |
| 2015/0092508 | A1 | 4/2015 | Bains |
| 2015/0109871 | A1 | 4/2015 | Bains et al. |
| 2015/0120999 | A1 | 4/2015 | Kim et al. |
| 2015/0134897 | A1 | 5/2015 | Sriramagiri et al. |
| 2015/0155025 | A1 | 6/2015 | Lee et al. |
| 2015/0162064 | A1 | 6/2015 | Oh et al. |
| 2015/0162067 | A1 | 6/2015 | Kim et al. |
| 2015/0170728 | A1 | 6/2015 | Jung et al. |
| 2015/0170733 | A1 | 6/2015 | Lee et al. |
| 2015/0199126 | A1 | 7/2015 | Jayasena et al. |
| 2015/0206572 | A1 | 7/2015 | Lim et al. |
| 2015/0213872 | A1 | 7/2015 | Mazumder et al. |
| 2015/0243339 | A1 | 8/2015 | Bell et al. |
| 2015/0255140 | A1 | 9/2015 | Song |
| 2015/0279441 | A1 | 10/2015 | Greenberg et al. |
| 2015/0279442 | A1 | 10/2015 | Hwang |
| 2015/0294711 | A1 | 10/2015 | Gaither et al. |
| 2015/0340077 | A1 | 11/2015 | Akamatsu |
| 2015/0356048 | A1 | 12/2015 | King |
| 2015/0380073 | A1 | 12/2015 | Joo et al. |
| 2016/0019940 | A1 | 1/2016 | Jang et al. |
| 2016/0027498 | A1 | 1/2016 | Ware et al. |
| 2016/0027531 | A1 | 1/2016 | Jones et al. |
| 2016/0027532 | A1 | 1/2016 | Kim |
| 2016/0042782 | A1 | 2/2016 | Narui et al. |
| 2016/0070483 | A1 | 3/2016 | Yoon et al. |
| 2016/0078846 | A1 | 3/2016 | Liu et al. |
| 2016/0078911 | A1 | 3/2016 | Fujiwara et al. |
| 2016/0085466 | A1 | 3/2016 | Benedict et al. |
| 2016/0086649 | A1 | 3/2016 | Hong et al. |
| 2016/0093402 | A1 | 3/2016 | Kitagawa et al. |
| 2016/0125931 | A1 | 5/2016 | Doo et al. |
| 2016/0133314 | A1 | 5/2016 | Hwang et al. |
| 2016/0155491 | A1 | 6/2016 | Roberts et al. |
| 2016/0180917 | A1 | 6/2016 | Chishti et al. |
| 2016/0180921 | A1 | 6/2016 | Jeong |
| 2016/0196863 | A1 | 7/2016 | Shin et al. |
| 2016/0202926 | A1 | 7/2016 | Benedict |
| 2016/0224262 | A1 | 8/2016 | Mandava et al. |
| 2016/0225433 | A1 | 8/2016 | Bains et al. |
| 2016/0239663 | A1 | 8/2016 | Healy et al. |
| 2016/0336060 | A1 | 11/2016 | Shin |
| 2016/0343423 | A1 | 11/2016 | Shido |
| 2016/0352518 | A1 | 12/2016 | Ford et al. |
| 2017/0011792 | A1 | 1/2017 | Oh et al. |
| 2017/0047110 | A1 | 2/2017 | Kang et al. |
| 2017/0052722 | A1 | 2/2017 | Ware et al. |
| 2017/0062038 | A1 | 3/2017 | Doo et al. |
| 2017/0076779 | A1 | 3/2017 | Bains et al. |
| 2017/0092350 | A1 | 3/2017 | Halbert et al. |
| 2017/0110177 | A1 | 4/2017 | Lee et al. |
| 2017/0111792 | A1 | 4/2017 | Correia Fernandes et al. |
| 2017/0117030 | A1 | 4/2017 | Fisch et al. |
| 2017/0133085 | A1 | 5/2017 | Kim et al. |
| 2017/0133108 | A1 | 5/2017 | Lee et al. |
| 2017/0140807 | A1 | 5/2017 | Sun et al. |
| 2017/0140810 | A1 | 5/2017 | Choi et al. |
| 2017/0140811 | A1 | 5/2017 | Joo |
| 2017/0146598 | A1 | 5/2017 | Kim et al. |
| 2017/0148504 | A1 | 5/2017 | Saifuddin et al. |
| 2017/0177246 | A1 | 6/2017 | Miller et al. |
| 2017/0177505 | A1 | 6/2017 | Basak et al. |
| 2017/0186481 | A1 | 6/2017 | Oh et al. |
| 2017/0213586 | A1 | 7/2017 | Kang et al. |
| 2017/0221546 | A1 | 8/2017 | Loh et al. |
| 2017/0263305 | A1 | 9/2017 | Cho |
| 2017/0264428 | A1 | 9/2017 | Seger |
| 2017/0269861 | A1 | 9/2017 | Lu et al. |
| 2017/0287547 | A1 | 10/2017 | Ito et al. |
| 2017/0323675 | A1 | 11/2017 | Jones et al. |
| 2017/0345482 | A1 | 11/2017 | Balakrishnan |
| 2017/0352404 | A1 | 12/2017 | Lee et al. |
| 2018/0005690 | A1 | 1/2018 | Morgan et al. |
| 2018/0025770 | A1 | 1/2018 | Ito et al. |
| 2018/0025772 | A1 | 1/2018 | Lee et al. |
| 2018/0025773 | A1 | 1/2018 | Bains et al. |
| 2018/0033479 | A1 | 2/2018 | Lea et al. |
| 2018/0047110 | A1 | 2/2018 | Blackman et al. |
| 2018/0061476 | A1 | 3/2018 | Kim |
| 2018/0061483 | A1 | 3/2018 | Morgan |
| 2018/0061485 | A1 | 3/2018 | Joo |
| 2018/0075927 | A1 | 3/2018 | Jeong et al. |
| 2018/0082736 | A1 | 3/2018 | Jung |
| 2018/0082737 | A1 | 3/2018 | Lee |
| 2018/0096719 | A1 | 4/2018 | Tomishima et al. |
| 2018/0102776 | A1 | 4/2018 | Chandrasekar et al. |
| 2018/0107417 | A1 | 4/2018 | Shechter et al. |
| 2018/0108401 | A1 | 4/2018 | Choi et al. |
| 2018/0114561 | A1 | 4/2018 | Fisch et al. |
| 2018/0114565 | A1 | 4/2018 | Lee |
| 2018/0122454 | A1 | 5/2018 | Lee et al. |
| 2018/0130506 | A1 | 5/2018 | Kang et al. |
| 2018/0137005 | A1 | 5/2018 | Wu et al. |
| 2018/0158504 | A1 | 6/2018 | Akamatsu |
| 2018/0158507 | A1 | 6/2018 | Bang |
| 2018/0182445 | A1 | 6/2018 | Lee et al. |
| 2018/0190340 | A1 | 7/2018 | Kim et al. |
| 2018/0218767 | A1 | 8/2018 | Wolff |
| 2018/0226119 | A1 | 8/2018 | Kim et al. |
| 2018/0233197 | A1 | 8/2018 | Laurent |
| 2018/0240511 | A1 | 8/2018 | Yoshida et al. |
| 2018/0247876 | A1 | 8/2018 | Kim et al. |
| 2018/0254078 | A1 | 9/2018 | We et al. |
| 2018/0261268 | A1 | 9/2018 | Hyun et al. |
| 2018/0276150 | A1 | 9/2018 | Eckert et al. |
| 2018/0285007 | A1 | 10/2018 | Franklin et al. |
| 2018/0294028 | A1 | 10/2018 | Lee et al. |
| 2018/0308539 | A1 | 10/2018 | Ito et al. |
| 2018/0341553 | A1 | 11/2018 | Koudele et al. |
| 2018/0342282 | A1 | 11/2018 | Morgan |
| 2019/0013059 | A1 | 1/2019 | Akamatsu |
| 2019/0043558 | A1 | 2/2019 | Suh et al. |
| 2019/0051344 | A1 | 2/2019 | Bell et al. |
| 2019/0051347 | A1 | 2/2019 | Lee |

(56) References Cited

U.S. PATENT DOCUMENTS

| | | | |
|---|---|---|---|
| 2019/0065087 A1 | 2/2019 | Li et al. | |
| 2019/0066759 A1 | 2/2019 | Nale | |
| 2019/0066766 A1 | 2/2019 | Lee | |
| 2019/0088315 A1 | 3/2019 | Saenz et al. | |
| 2019/0088316 A1 | 3/2019 | Inuzuka et al. | |
| 2019/0103147 A1 | 4/2019 | Jones et al. | |
| 2019/0115069 A1 | 4/2019 | Lai | |
| 2019/0122722 A1 | 4/2019 | Yamada et al. | |
| 2019/0122723 A1 | 4/2019 | Ito et al. | |
| 2019/0129651 A1 | 5/2019 | Wuu et al. | |
| 2019/0130960 A1 | 5/2019 | Kim | |
| 2019/0130961 A1 | 5/2019 | Bell et al. | |
| 2019/0139599 A1 | 5/2019 | Ito et al. | |
| 2019/0147964 A1 | 5/2019 | Yun et al. | |
| 2019/0161341 A1 | 5/2019 | Howe | |
| 2019/0190341 A1 | 6/2019 | Beisele et al. | |
| 2019/0196730 A1 | 6/2019 | Imran | |
| 2019/0198078 A1 | 6/2019 | Hoang et al. | |
| 2019/0198099 A1 | 6/2019 | Mirichigni et al. | |
| 2019/0205253 A1 | 7/2019 | Roberts | |
| 2019/0228810 A1 | 7/2019 | Jones et al. | |
| 2019/0228815 A1 | 7/2019 | Morohashi et al. | |
| 2019/0237131 A1 | 8/2019 | Ito | |
| 2019/0237132 A1 | 8/2019 | Morohashi | |
| 2019/0252020 A1 | 8/2019 | Rios et al. | |
| 2019/0267077 A1 | 8/2019 | Ito et al. | |
| 2019/0279706 A1 | 9/2019 | Kim | |
| 2019/0294348 A1 | 9/2019 | Ware et al. | |
| 2019/0333573 A1 | 10/2019 | Shin et al. | |
| 2019/0347019 A1 | 11/2019 | Shin et al. | |
| 2019/0348100 A1 | 11/2019 | Smith et al. | |
| 2019/0348102 A1 | 11/2019 | Smith et al. | |
| 2019/0348103 A1 | 11/2019 | Jeong et al. | |
| 2019/0362774 A1 | 11/2019 | Kuramori et al. | |
| 2019/0371390 A1 | 12/2019 | Ito | |
| 2019/0385661 A1 | 12/2019 | Koo et al. | |
| 2019/0385667 A1 | 12/2019 | Morohashi et al. | |
| 2019/0385668 A1 | 12/2019 | Fujioka et al. | |
| 2019/0385670 A1 | 12/2019 | Notani et al. | |
| 2019/0386557 A1 | 12/2019 | Wang et al. | |
| 2019/0391760 A1 | 12/2019 | Miura et al. | |
| 2019/0392886 A1 | 12/2019 | Cox et al. | |
| 2020/0005857 A1 | 1/2020 | Ito et al. | |
| 2020/0051616 A1 | 2/2020 | Cho | |
| 2020/0075086 A1 | 3/2020 | Hou et al. | |
| 2020/0082873 A1 | 3/2020 | Wolff | |
| 2020/0126611 A1 | 4/2020 | Riho et al. | |
| 2020/0135263 A1 | 4/2020 | Brown et al. | |
| 2020/0143871 A1 | 5/2020 | Kim et al. | |
| 2020/0176050 A1 | 6/2020 | Ito et al. | |
| 2020/0185026 A1 | 6/2020 | Yun et al. | |
| 2020/0194050 A1 | 6/2020 | Akamatsu | |
| 2020/0194056 A1 | 6/2020 | Sakurai et al. | |
| 2020/0202921 A1 | 6/2020 | Morohashi et al. | |
| 2020/0210278 A1 | 7/2020 | Rooney et al. | |
| 2020/0211632 A1 | 7/2020 | Noguchi | |
| 2020/0211633 A1 | 7/2020 | Okuma | |
| 2020/0211634 A1 | 7/2020 | Ishikawa et al. | |
| 2020/0219555 A1 | 7/2020 | Rehmeyer | |
| 2020/0219556 A1 | 7/2020 | Ishikawa et al. | |
| 2020/0265888 A1 | 8/2020 | Ito et al. | |
| 2020/0273517 A1 | 8/2020 | Yamamoto | |
| 2020/0273518 A1 | 8/2020 | Raad et al. | |
| 2020/0279599 A1 | 9/2020 | Ware et al. | |
| 2020/0294569 A1 | 9/2020 | Wu et al. | |
| 2020/0294576 A1 | 9/2020 | Brown et al. | |
| 2020/0321049 A1 | 10/2020 | Meier et al. | |
| 2020/0381040 A1 | 12/2020 | Penney et al. | |
| 2020/0388324 A1 | 12/2020 | Rehmeyer et al. | |
| 2020/0388325 A1 | 12/2020 | Cowles et al. | |
| 2020/0395063 A1 | 12/2020 | Rehmeyer | |
| 2020/0402568 A1 | 12/2020 | He et al. | |
| 2021/0057021 A1 | 2/2021 | Wu et al. | |
| 2021/0057022 A1 | 2/2021 | Jenkinson et al. | |
| 2021/0109577 A1* | 4/2021 | Mandava | G06F 13/1668 |
| 2021/0118491 A1 | 4/2021 | Li et al. | |
| 2021/0166752 A1 | 6/2021 | Noguchi | |
| 2021/0183433 A1 | 6/2021 | Jenkinson et al. | |
| 2021/0183435 A1 | 6/2021 | Meier et al. | |
| 2021/0223852 A1 | 7/2021 | Chang et al. | |
| 2021/0225431 A1 | 7/2021 | Rehmeyer et al. | |
| 2021/0304813 A1 | 9/2021 | Cowles et al. | |
| 2021/0335411 A1 | 10/2021 | Wu et al. | |
| 2021/0350844 A1 | 11/2021 | Morohashi et al. | |
| 2021/0406170 A1 | 12/2021 | Jung et al. | |
| 2022/0051716 A1 | 2/2022 | Ayyapureddi | |
| 2022/0059153 A1 | 2/2022 | Zhang et al. | |
| 2022/0059158 A1 | 2/2022 | Wu et al. | |
| 2022/0068361 A1 | 3/2022 | Du et al. | |
| 2022/0091784 A1* | 3/2022 | Brandl | G11C 11/40611 |
| 2022/0093165 A1 | 3/2022 | Mitsubori et al. | |
| 2022/0165328 A1 | 5/2022 | Ishikawa et al. | |
| 2022/0189537 A1* | 6/2022 | Kim | G06F 3/0644 |
| 2022/0189539 A1 | 6/2022 | Li et al. | |
| 2022/0199144 A1 | 6/2022 | Roberts | |
| 2022/0199150 A1 | 6/2022 | Song et al. | |
| 2022/0270670 A1 | 8/2022 | Wu et al. | |
| 2022/0270672 A1 | 8/2022 | Kim et al. | |
| 2023/0105151 A1 | 4/2023 | Brown et al. | |
| 2023/0168818 A1 | 6/2023 | You et al. | |
| 2023/0298654 A1 | 9/2023 | Du et al. | |
| 2023/0352075 A1 | 11/2023 | Suzuki | |
| 2023/0352076 A1 | 11/2023 | He et al. | |
| 2024/0038288 A1 | 2/2024 | Kim et al. | |
| 2024/0062798 A1 | 2/2024 | Cowles et al. | |
| 2024/0071460 A1 | 2/2024 | Noguchi | |
| 2024/0339146 A1 | 10/2024 | Kim | |
| 2025/0111045 A1 | 4/2025 | Lee et al. | |
| 2025/0111872 A1 | 4/2025 | Choi et al. | |
| 2025/0173255 A1 | 5/2025 | Rooney | |

FOREIGN PATENT DOCUMENTS

| | | | |
|---|---|---|---|
| CN | 1879173 | A | 12/2006 |
| CN | 101026003 | A | 8/2007 |
| CN | 101038785 | A | 9/2007 |
| CN | 101047025 | A | 10/2007 |
| CN | 101067972 | A | 11/2007 |
| CN | 101075477 | A | 11/2007 |
| CN | 101091221 | A | 12/2007 |
| CN | 101211653 | A | 7/2008 |
| CN | 101217060 | A | 7/2008 |
| CN | 101243450 | A | 8/2008 |
| CN | 102301423 | A | 12/2011 |
| CN | 102663155 | A | 9/2012 |
| CN | 102737706 | A | 10/2012 |
| CN | 102931187 | A | 2/2013 |
| CN | 104350546 | A | 2/2015 |
| CN | 104733035 | A | 6/2015 |
| CN | 104737234 | A | 6/2015 |
| CN | 104781885 | A | 7/2015 |
| CN | 104981874 | A | 10/2015 |
| CN | 105378847 | A | 3/2016 |
| CN | 105529047 | A | 4/2016 |
| CN | 106158005 | A | 11/2016 |
| CN | 106710621 | A | 5/2017 |
| CN | 106816169 | A | 6/2017 |
| CN | 107017016 | A | 8/2017 |
| CN | 107025927 | A | 8/2017 |
| CN | 107301874 | A | 10/2017 |
| CN | 107871516 | A | 4/2018 |
| CN | 107919150 | A | 4/2018 |
| CN | 108154895 | A | 6/2018 |
| CN | 108242248 | A | 7/2018 |
| CN | 108806740 | A | 11/2018 |
| CN | 109727624 | A | 5/2019 |
| CN | 109949844 | A | 6/2019 |
| CN | 110032897 | A | 7/2019 |
| CN | 110520929 | A | 11/2019 |
| CN | 110678925 | A | 1/2020 |
| CN | 110827884 | A | 2/2020 |
| CN | 111052243 | A | 4/2020 |
| CN | 111247586 | A | 6/2020 |
| CN | 111354393 | A | 6/2020 |

(56) References Cited

FOREIGN PATENT DOCUMENTS

| | | | |
|---|---|---|---|
| CN | 111383682 | A | 7/2020 |
| CN | 114121076 | A | 3/2022 |
| JP | S6282887 | A | 4/1987 |
| JP | 2003085054 | A | 3/2003 |
| JP | 2005-216429 | A | 8/2005 |
| JP | 2011-258259 | A | 12/2011 |
| JP | 4911510 | B2 | 1/2012 |
| JP | 2013-004158 | A | 1/2013 |
| JP | 2014238903 | A | 12/2014 |
| JP | 6281030 | B1 | 1/2018 |
| KR | 20030063947 | A | 7/2003 |
| KR | 20070109104 | A | 11/2007 |
| KR | 20160134411 | A | 11/2016 |
| KR | 20170053373 | A | 5/2017 |
| KR | 20170093053 | A | 8/2017 |
| KR | 20180011642 | A | 2/2018 |
| KR | 20180081989 | A | 7/2018 |
| KR | 20180101647 | A | 9/2018 |
| KR | 20190046572 | A | 5/2019 |
| TW | 201801079 | A | 1/2018 |
| WO | 2014120477 | | 8/2014 |
| WO | 2015030991 | A1 | 3/2015 |
| WO | 2017171927 | A1 | 10/2017 |
| WO | 2019079157 | A1 | 4/2019 |
| WO | 2019083884 | A1 | 5/2019 |
| WO | 2019222960 | A1 | 11/2019 |
| WO | 2020010010 | A1 | 1/2020 |
| WO | 2020117686 | A1 | 6/2020 |
| WO | 2020247163 | A1 | 12/2020 |
| WO | 2020247639 | A1 | 12/2020 |

OTHER PUBLICATIONS

U.S. Appl. No. 16/797,658, titles "Apparatuses and Methods for Controlling Refresh Operations", filed Feb. 21, 2020.
U.S. Appl. No. 16/818,981 titled "Apparatuses and Methods for Staggered Timing of Targeted Refresh Operations" filed Mar. 13, 2020.
U.S. Appl. No. 16/824,460, titled "Semiconductor Device Performing Row Hammer Refresh Operation", dated Mar. 19, 2020.
U.S. Appl. No. 16/025,844, titled "Apparatus and Methods for Triggering Row Hammer Address Sampling", filed Jul. 2, 2018.
U.S. Appl. No. 16/783,063, titled "Apparatus and Methods for Triggering Row Hammer Address Sampling", dated Feb. 5, 2020.
U.S. Appl. No. 16/805,197, titled "Apparatuses and Methods for Calculating Row Hammer Refresh Addresses in a Semiconductor Device", dated Feb. 28, 2020.
U.S. Appl. No. 16/232,837, titled "Apparatuses and Methods for Distributed Targeted Refresh Operations", filed Dec. 26, 2018.
U.S. Appl. No. 16/818,989, titled "Semiconductor Device Performing Row Hammer Refresh Operation", dated Mar. 13, 2020.
U.S. Appl. No. 16/869,359, titled "Apparatus and Methods for Refreshing Memory", filed May 7, 2020.
U.S. Appl. No. 16/286,187 titled "Apparatuses and Methods for Memory Mat Refresh Sequencing" filed Feb. 26, 2019.
U.S. Appl. No. 16/084,119, titled "Apparatuses and Methods for Pure-Time, Self Adopt Sampling for Row Hammer Refresh Sampling", filed Sep. 11, 2018.
U.S. Appl. No. 16/886,284 titled "Apparatuses and Methods for Access Based Refresh Timing" filed May 28, 2020.
U.S. Appl. No. 16/886,284, titled "Apparatuses and Methods for Access Based Refresh Timing", dated May 28, 2020.
U.S. Appl. No. 16/375,716 titled "Apparatuses and Methods for Staggered Timing of Targeted Refresh Operations" filed Apr. 4, 2019; pp. all.
U.S. Appl. No. 16/428,625 titled "Apparatuses and Methods for Tracking Victim Rows" filed May 31, 2019.
U.S. Appl. No. 16/432,604 titled "Apparatuses and Methods for Staggered Timing of Skipped Refresh Operations" filed Jun. 5, 2019.
U.S. Appl. No. 17/008,396 titled "Apparatuses and Methods for Staggered Timing of Targeted Refresh Operations" filed Aug. 31, 2020.
[Published as US-2021-0057021-A1] U.S. Appl. No. 16/546,152 titled "Apparatuses and Methods for Analog Row Access Tracking" filed Aug. 20, 2019.
U.S. Appl. No. 16/549,411 titled "Apparatuses and Methods for Dynamic Refresh Allocation" filed Aug. 23, 2019.
U.S. Appl. No. 16/655,110 titled "Apparatuses and Methods for Dynamic Targeted Refresh Steals" filed Oct. 16, 2019.
U.S. Appl. No. 17/186,913 titled "Apparatuses and Methods for Dynamic Refresh Allocation" filed Feb. 26, 2021.
U.S. Appl. No. 17/187,002 titled "Apparatuses and Methods for Staggered Timing of Targeted Refresh Operations" filed Feb. 26, 2021.
U.S. Appl. No. 17/347,957 titled "Apparatuses and Methods for Controlling Steal Rates" filed Jun. 15, 2021.
U.S. Appl. No. 17/662,733, titled "Apparatuses, Systems, and Methods for Identifying Victim Rows in a Memorydevice Which Cannot Be Simultaneously Refreshed" filed May 10, 2022.
Anonymous: "Frequency—Wikipedia", Dec. 17, 2018, retrieved from URL: https://en.wikipedia.org/w/index.php?title=Frequency&oldid=874192848.
Exam Report for Application No. 16200792.6, dated Nov. 14, 2019.
First Office Action for Taiwanese Application No. 105134192, dated Nov. 20, 2017.
International Application No. PCT/US19/40169 titled "Apparatus and Methods for Triggering Row Hammer Address Sampling" filed Jul. 1, 2019.
International Application No. PCT/US19/64028, titled "Semiconductor Device Performing Row Hammer Refresh Operation", dated Dec. 2, 2019.
International Application No. PCT/US20/26689, titled "Apparatuses and Methods for Staggered Timing of Targeted Refresh Operations", dated Apr. 3, 2020.
International Preliminary Report on Patentability and Written Opinion for Application No. PCT/US2018/056871, dated Apr. 28, 2020.
International Search Report & Written Opinion dated Aug. 28, 2020 for PCT Application No. PCT/US2020/032931.
International Search Report & Written Opinion dated Mar. 24, 2020 for PCT Application No. PCT/US2019/064028, 11 pages.
International Search Report and Written Opinion dated Feb. 12, 2019 for PCT Application PCT/US2018/056871, 9 pages.
International Search Report and Written Opinion dated Feb. 20, 2019 for PCT Application No. PCT/CN2018/088203, 9 pages.
International Search Report and Written Opinion dated Jan. 29, 2019 for PCT Application No. PCT/US2018/055821, 9 pages.
International Search Report and Written Opinion for PCT/US2020/026689 mailed on Jul. 22, 2020.
International Search Report and Written Opinion for Application No. PCT/US2019/040169, dated Oct. 25, 2019.
International Search Report and Written Opinion for Application No. PCT/US2020/036133, dated Sep. 11, 2020.
International Search Report and Written Opinion for PCT Appl. No. PCT/US2016/037673 dated Jun. 18, 2019.
IPRP dated Apr. 30, 2020 for PCT Application No. PCT/US2018/055821, 6 pgs.
IPRP dated Dec. 3, 2020 for PCT Application No. PCT/CN2018/088203.
IPRP dated Jun. 17, 2021 for PCT Appl. No. PCT/US2019/064028.
PCT Application No. PCT/US20/32931, titled "Apparatuses and Methods for Controlling Steal Rates", dated May 14, 2020.
Second Office Action for EP Application No. 16200792.6 dated Mar. 5, 2019.
U.S. Appl. No. 16/548,027 titled "Apparatuses, Systems, and Methods for Analog Row Access Rate Determination" filed Aug. 22, 2019.
U.S. Appl. No. 16/549,942 titled "Apparatuses and Methods for Lossy Row Access Counting" filed Aug. 23, 2019.Pub.
U.S. Appl. No. 16/788,657, titled "Semiconductor Device Performing Row Hammer Refresh Operation", dated Feb. 12, 2020.

(56) References Cited

OTHER PUBLICATIONS

U.S. Appl. No. 17/324,621 titled "Apparatuses and Methods for Pure-Time, Self-Adopt Sampling for Row Hammer Refresh Sampling" filed May 19, 2021.
U.S. Appl. No. 18/064,773, filed Dec. 12, 2022 titled, "Apparatuses and Methods for Access Based Refresh Timing."
U.S. Appl. No. 18/746,551 titled "Apparatuses and Methods for Direct Refresh Management Attack Identification" filed Jun. 18, 2024, pp. all pages of the application as filed.
U.S. Appl. No. 18/747,740, titled "Apparatuses and Methods Refresh Rate Register Adjustment Based on Refresh Queue" filed Jun. 19, 2024, pp. all pages of application as filed.
U.S. Appl. No. 18/774,730 titled "Apparatuses and Methods for Controller Signaling of Refresh Operations" filed Jul. 16, 2024, pp. all pages of the application as filed.
U.S. Appl. No. 15/881,256 entitled 'Apparatuses and Methods for Detecting a Row Hammer Attack With a Bandpass Filter' filed Jan. 26, 2018.
U.S. Appl. No. 16/425,525 titled "Apparatuses and Methods for Tracking All Row Accesses" filed May 29, 2019.
U.S. Appl. No. 16/427,105 titled "Apparatuses and Methods for Priority Targeted Refresh Operations" filed May 30, 2019.
U.S. Appl. No. 16/427,140 titled "Apparatuses and Methods for Tracking Row Access Counts Between Multiple Register Stacks" filed May 30, 2019.
U.S. Appl. No. 16/437,811 titled "Apparatuses, Systems, and Methods for Determining Extremum Numerical Values" filed Jun. 11, 2019.
U.S. Appl. No. 16/513,400 titled "Apparatuses and Methods for Tracking Row Accesses" filed Jul. 16, 2019.
U.S. Appl. No. 16/537,981 titled "Apparatuses and Methods for Controlling Targeted Refresh Rates" filed Aug. 12, 2019.
U.S. Appl. No. 16/699,977, titled "Apparatuses and Methods for Access Based Random Sampling", filed Dec. 2, 2019.
U.S. Appl. No. 16/994,338 titled "Apparatuses, Systems, and Methods for Memory Directed Access Pause" filed Aug. 14, 2020.
U.S. Appl. No. 16/997,766 titled "Refresh Logic Circuit Layouts Thereof" filed Aug. 19, 2020.
U.S. Appl. No. 16/997,659 titled "Apparatuses, Systems, and Methods for Refresh Modes" filed Aug. 19, 2020.
U.S. Appl. No. 17/095,978 titled "Apparatuses and Methods for Controlling Refresh Timing" filed Nov. 12, 2020.
U.S. Appl. No. 17/127,654 titled "Apparatuses and Methods for Row Hammer Based Cache Lockdown" filed Dec. 18, 2020.
U.S. Appl. No. 17/175,485 titled "Apparatuses and Methods for Distributed Targeted Refresh Operations" filed Feb. 12, 2021.
U.S. Appl. No. 15/789,897, entitled "Apparatus and Methods for Refreshing Memory", filed Oct. 20, 2017; pp. all.
U.S. Appl. No. 15/796,340, entitled: "Apparatus and Methods for Refreshing Memory" filed Oct. 27, 2017; pp. all.
U.S. Appl. No. 16/012,679, titled "Apparatuses and Methods for Multiple Row Hammer Refresh Address Sequences", filed Jun. 19, 2018.
U.S. Appl. No. 16/020,863, titled "Semiconductor Device", filed Jun. 27, 2018.
U.S. Appl. No. 16/112,471 titled "Apparatuses and Methods for Controlling Refresh Operations" filed Aug. 24, 2018.
U.S. Appl. No. 16/160,801, titled "Apparatuses and Methods for Selective Row Refreshes" filed Oct. 15, 2018; pp all.
U.S. Appl. No. 16/176,932, titled "Apparatuses and Methods for Access Based Refresh Timing", filed Oct. 31, 2018.
U.S. Appl. No. 16/208,217, titled "Semiconductor Device Performing Row Hammer Refresh Operation", filed Dec. 3, 2018.
U.S. Appl. No. 16/228,446, titled "Apparatuses and Methods for Variable Address Sample Timing", filed Dec. 20, 2018.
U.S. Appl. No. 16/228,484, titled "Apparatuses and Methods for Sample Signal Timing With Multiple Clocks", filed Dec. 20, 2018.
U.S. Appl. No. 16/230,300, titled "Apparatuses and Methods for Staggered Timing of Targeted Refresh Operations" filed Dec. 21, 2018.
U.S. Appl. No. 16/231,327 titled "Apparatuses and Methods for Selective Row Refreshes", filed Dec. 21, 2018.
U.S. Appl. No. 16/237,291, titled "Apparatus and Methods for Refreshing Memory", filed Dec. 31, 2018.
U.S. Appl. No. 16/268,818, titled "Apparatuses and Methods for Managing Row Access Counts", filed Feb. 6, 2019.
U.S. Appl. No. 16/290,730, titled "Semiconductor Device Performing Row Hammer Refresh Operation", filed Mar. 1, 2019.
U.S. Appl. No. 16/358,587, titled "Semiconductor Device Having Cam That Stores Address Signals", dated Mar. 19, 2019.
U.S. Appl. No. 16/374,623, titled "Semiconductor Device Performing Row Hammer Refresh Operation", filed Apr. 3, 2019.
U.S. Appl. No. 16/411,573 titled "Apparatuses, Systems, and Methods for a Content Addressable Memory Cell" filed May 14, 2019.
U.S. Appl. No. 16/411,698 title "Semiconductor Device" filed May 14, 2019.
U.S. Appl. No. 16/427,330 titled "Apparatuses and Methods for Storing Victim Row Data" filed May 30, 2019.
U.S. Appl. No. 16/431,641 titled "Apparatuses and Methods for Controlling Steal Rates" filed Jun. 4, 2019.
U.S. Appl. No. 16/452,196 titled "Apparatuses and Methods for Address Sampling Randomization" filed Jun. 25, 2019.
U.S. Appl. No. 16/545,489 titled "Apparatuses and Methods for Detecting a Row Hammer Attack With a Bandpass Filter" filed Aug. 20, 2019.
U.S. Appl. No. 16/682,606, titled "Apparatuses And Methods For Distributing Row Hammer Refresh Events Across A Memory Device ", filed Nov. 13 2019.
U.S. Appl. No. 16/816,017, titled "Apparatuses and Methods for Sample Signal Timing With Multiple Clocks", dated Mar. 11, 2020.
U.S. Appl. No. 17/654,035, titled "Apparatuses and Methods for Dynamic Targeted Refresh Steals", filed Mar. 8, 2022; pp. all pages of application as filed.
U.S. Appl. No. 17/731,529, titled "Apparatuses and Methods for Access Based Refresh Operations"; filed Apr. 28, 2022; pp. all pages of the application as filed.
U.S. Appl. No. 15/876,566 entitled 'Apparatuses and Methods for Calculating Row Hammer Refresh Addresses in a Semiconductor Device' filed Jan. 22, 2018.
U.S. Appl. No. 17/226,975, titled "Apparatuses and Methods for Staggered Timing of Skipped Refresh Operations" filed Apr. 9, 2021, pp. all , Jul. 22, 2021.
Kyungbae Park et al. "Experiments and Root Cause Anaylsis for Active-Precharge Hammering Fault in DDR3 SDRAM Under 3 X NM Technology"; Microelectronics Reliability: An Internet Journal and World Abstracting Service; vol. 57; Dec. 23, 2015; pp. 39-46.
PCT Application No. PCT/US18/55821 "Apparatus and Methods for Refreshing Memory" filed Oct. 15, 2018.
U.S. Appl. No. 15/888,993, entitled "Apparatuses and Methods for Controlling Refresh Operations", filed Feb. 5, 2018.
U.S. Appl. No. 16/190,627 titled "Apparatuses and Methods for Targeted Refreshing of Memory" filed Nov. 14, 2018.
U.S. Appl. No. 16/459,520 titled "Apparatuses and Methods for Monitoring Word Line Accesses", filed Jul. 1, 2019.
U.S. Appl. No. 16/386,775 titled "Apparatuses and Methods for Random Signal Generation" filed Apr. 17, 2019.
U.S. Appl. No. 17/030,018, titled "Apparatuses and Methods for Controlling Refresh Operations", filed Sep. 23, 2020.
"EP Search Report for app. # 16200792.6 dated Feb. 22, 2017".
International Search Report and Written Opinion for PCT Appl. No. PCT/US2016/54878 dated Jan. 19, 2017.
IPRP for PCT/US2020/026689, mailed Sep. 28, 2021.
1st Office Action dated Jan. 26, 2017 for CN.01 Application No. 201480007334.X.
U.S. Appl. No. 15/281,818, entitled: "Semiconductor Device" filed on Sep. 30, 2016.
Kim , et al. , "Flipping Bits in MemoryWithout Accessing Them: An Experimental Study of DRAM Disturbance Errors", IEEE, Jun. 2014.
Park, Kyungbae , et al. , , Experiments and Root Cause Analysis for Active-Precharge Hammering Fault in DDR3 SDRAM Under 3 X

(56) References Cited

OTHER PUBLICATIONS

NM Technology; Microelectronics Reliability: An Internet. Journal and World Abstracting Service; vol. 57, Dec. 23, 2015; pp. 39-46.

* cited by examiner

APPARATUSES AND METHODS FOR ACCESS BASED TARGETED REFRESH OPERATIONS

CROSS REFERENCE TO RELATED APPLICATION(S)

This application is a divisional of U.S. patent application Ser. No. 17/731,645 filed Apr. 28, 2022. The aforementioned application is incorporated herein by reference, in its entirety, for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

In volatile memory devices, the information may decay over time. To prevent information from being refreshed, the information may be periodically refreshed (e.g., by restoring the charge on a memory cell to an initial level). However, refresh operations may require time which could have otherwise been used for access operations in the memory.

DETAILED DESCRIPTION

Figure 1:
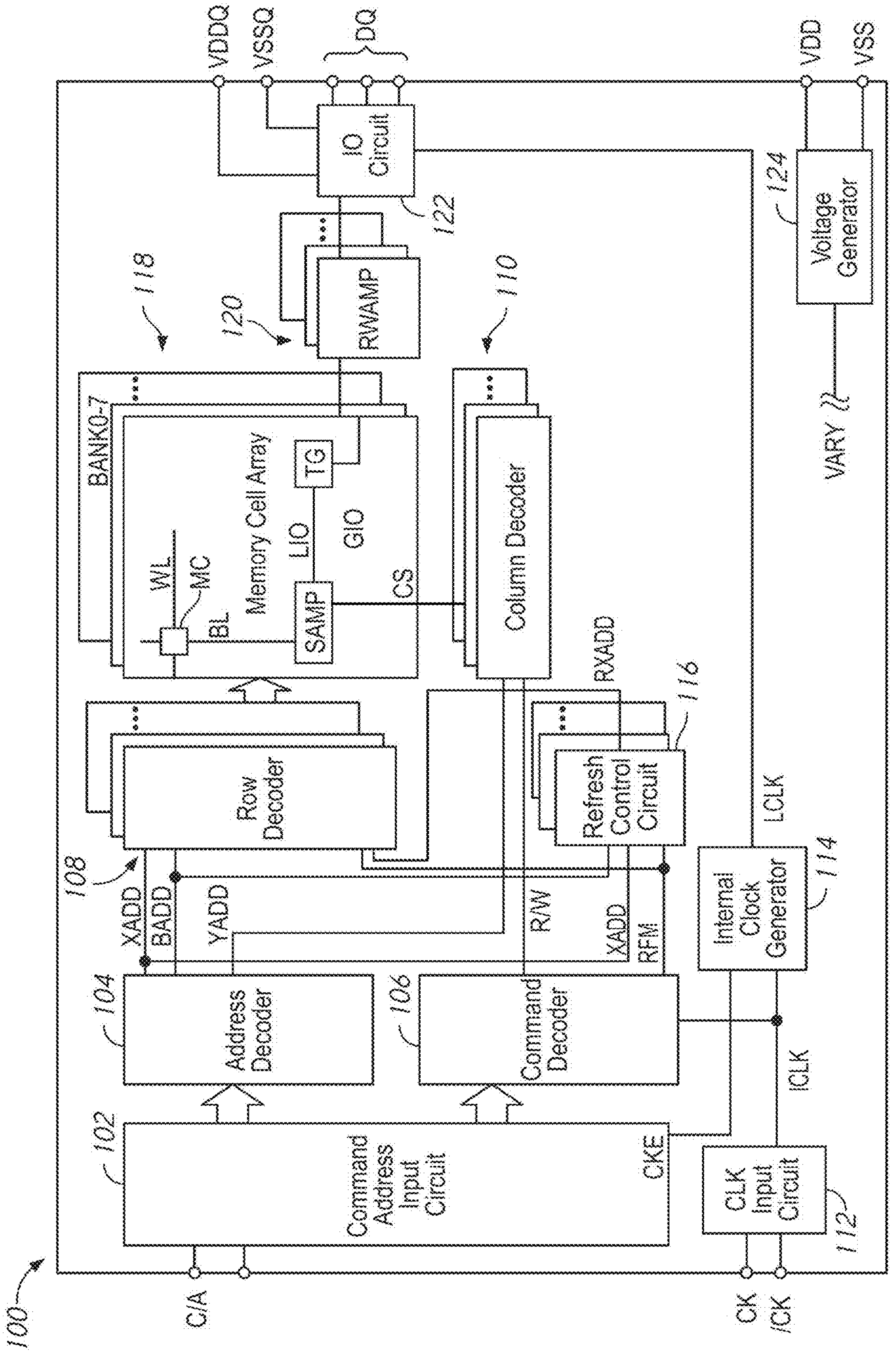
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). To prevent information from being lost, the memory may refresh memory cells on a row-by-row basis (or in sets of rows). Over the course a refresh cycle, the memory may refresh the memory cells as part of sequential refresh operations. The memory may have a refresh period, tREFI, which determines the maximum timing between refresh operations in order to ensure that all memory cells are refreshed over the course of a refresh cycle. For example, tREFI may be based on the expected time at which any individual memory cell needs to be refreshed divided by a total number of refresh operations in a refresh cycle (e.g., a number of rows or a number of rows refreshed per refresh operation). The refresh period tREFI may be relatively short (e.g., $<10$ μsec). The memory may refresh a first word line (or a first set of word lines) as part of a first sequential refresh operation, then refresh a second word line (or set of word lines) as part of a second sequential refresh operation and so forth until all word lines have been refreshed, then may restart from the beginning of the sequence.

Certain access patterns to the memory may change a rate at which information decays in the memory cells. For example, a row hammer may be repeated access to an 'aggressor' row of the memory, which may increase a rate of information decay in memory cells along nearby 'victim' word lines. Since the information in the victim word lines may decay faster than the assumptions used to calculate tREFI, it may be important to identify aggressors, and perform targeted refresh operations on the victims of those identified aggressors. In conventional memories, refresh operations may be called for every tREFI. Targeted refresh operations may 'steal' a timeslot which is otherwise set aside for a sequential refresh operation. However, this may inefficient, as targeted refresh operations need only be performed when an aggressor has been detected. Accordingly, conventional memories may include relatively logic which manages when to perform targeted refresh operations, what to do if a targeted refresh operation is called for but not aggressor is detected, how to adjust a rate of targeted to sequential refresh operations etc.

The present disclosure is drawn to apparatuses, systems, and methods for access based targeted refresh operations. A memory includes a memory bank which is divided into two or more sub-banks. Each sub-bank is associated with a refresh control circuit which includes an aggressor detector. When an aggressor address is detected in the associated sub-bank, the next time a word line is accessed in a different sub-bank, a targeted refresh operation is performed on the victims of the detected aggressor. In this manner, targeted refresh operations may occur 'as needed' in the sub-banks with timing based on accesses in the other sub-banks. This may simplify the logic for determining when to perform targeted refresh operations.

In some embodiments, the use of access operations in other sub-banks to control the timing of targeted refresh operations may be advantageous. Some memories may track accesses to each row of the memory to determine which rows are aggressors. For example, each row may have memory cells set aside which store an access count associated with that row. Based on the access count (e.g., a comparison to a threshold), the row may be determined to be an aggressor. When a targeted refresh operation is performed on the victims of that row, the count value should be reset, which requires accessing the aggressor row (to read, modify and write the count value). However, this requires time to access the aggressor row. After targeted refresh operations have refreshed the victims of the aggressor, the aggressor row may be accessed and it's count value reset responsive to a word line being accessed in a different sub-bank. This may allow the count value along the aggressor to be reset without interrupting normal access operations.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more sub-banks. While embodiments where each bank includes two sub-banks are generally described herein, other embodiments may include more sub-banks per bank.

Each memory sub-bank includes a plurality of word lines WL, a plurality of bit lines BLT, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 includes refresh control circuits 116, each associated with a bank or sub-bank of the memory array 118. Each refresh control circuit 116 may determine when to perform a refresh operation on the associated sub-bank. The refresh control circuit 116 provides a refresh address RXADD (along with one or more refresh signals, not shown in FIG. 1). The row decoder 108 performs a refresh operation on one or more word lines associated with RXADD.

The refresh control circuit 116 may perform multiple types of refresh operation, which may determine how the address RXADD is generated, as well as other details such as how many word lines are associated with the address RXADD. For example, the refresh control circuit 116 may perform sequential refresh operations, where the refresh address RXADD is generated based on a sequence of refresh operations. For example, after a first sequential refresh operation with an address RXADD, the next sequential refresh operation may generate an address RXADD+1. Sequential refresh addresses may be associated with multiple word lines, for example by truncating the address RXADD compared to a full row address XADD, and refreshing all word lines which share the truncated portion in common. Over the course of a refresh cycle, the sequential refresh operations may refresh all word lines in the sub array (e.g., by sequentially generating addresses associated with all word lines) and then the sequence may recycle.

The refresh control circuit 116 may perform sequential refresh operations with timing based on a refresh interval tREFI. The refresh interval tREFI may be based on expected timing for refreshing any given word line (e.g., based on an expected rate of information decay) as well as the number of refresh operations required to complete a refresh cycle (e.g., the number of sequential refresh operations per refresh cycle). Each tREFI, the refresh control circuit 116 may perform a sequential refresh operation. For example, a refresh signal REF may be generated each time tREFI elapses and responsive to the refresh signal REF, one or more sequential refresh operations may be performed.

As well as sequential refresh operations, the refresh control circuit 116 may perform targeted refresh operations, where the refresh address RXADD is based on a detected aggressor word line. Certain access patterns to a row may cause an increased rate of data decay in the memory cells of other nearby rows. For example, multiple accesses to a single row, a 'row hammer', may increase the rate of decay in memory cells along the nearby word lines. Since these memory cells may decay faster than the timing expected by tREFI, it is useful to identify these aggressor rows so that their victims can be refreshed.

The refresh control circuit may include logic which detects aggressors and then generates a refresh address RXADD based on the detected aggressor as part of a targeted refresh operation. For example, if the aggressor is AggXADD, then the refresh control circuit may refresh adjacent and/or nearby word lines such as one or more of AggXADD+1, AggXADD−1, AggXADD+2, AggXADD−2, etc. Various criterion may be used to detect aggressors. For example, the memory may count a number of accesses to different word lines (e.g., based on the row addresses XADD which are provided along a row address bus from the address decoder 104) and designate a row address as an aggressor when that count crosses a threshold. In some embodiments, the count of accesses to a given row may be stored along memory cells of that row. Accordingly, when a word line is accessed, the count may be read from the memory cells of that row, modified (e.g., incremented), compared to a threshold, and the changed count (e.g., either incremented or reset if the count was above the threshold) may be written back.

While the present disclosure may generally refer to detecting aggressor addresses and their victims, it should be understood that these term are used to mean rows which are used to calculate targeted refresh addresses. For example, it is not necessary that the aggressor address undergo an attack, such as a row hammer, or that there is actual increased data decay in the victims. In some embodiments, the memory may use sampling, which may introduce an aspect of randomness into the selection of aggressor addresses.

The refresh control circuit 116 may perform targeted refresh operations on a sub-bank with timing based, in part, on accesses to other sub-banks of the same bank. For example, if there are two sub-banks per bank, after an aggressor is detected in a second sub-bank when a word line is accessed in the first sub-bank, the refresh control circuit 116 may refresh one or more victims in the second sub-bank based on the detected aggressor. In this manner, targeted refresh commands may be performed in an 'on-demand' fashion, with timing based on accesses to different sub-banks The refresh control circuit 116 may also receive refresh management RFM commands which may cause the refresh control circuit 116 to perform a targeted refresh operation. The RFM command may be issued by a controller external to the device 100.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

FIG. 2 is a block diagram of refresh logic according to some embodiments of the present disclosure. The refresh logic may represent a portion of a memory device, such as the device 100 of FIG. 1, in some embodiments. The refresh logic 200 includes a refresh control circuit 210 (e.g., 116 of FIG. 1) and a pair of sub-banks 202 and 206, which are part of a same memory bank (e.g., one of the memory banks of the array 118 of FIG. 1). Once the refresh control circuit 210 has detected an aggressor address in one of the sub-banks, then when a word line is accessed in the other sub-bank, a targeted refresh may be performed. In the example of FIG. 2, a refresh control circuit 210 associated with the second sub-bank 206 is shown. Each sub-bank may have a similar refresh control circuit.

The refresh control circuit 210 includes an aggressor detector circuit 212 which activates a flag when an aggressor address RHR-RA has been detected in the associated sub-bank 206. Responsive to an activation command ACT, a logic circuit 218 may provide a targeted refresh signal RHR if the flag is active. If the flag is active, a comparator 214 may determine if the accessed row address Act-RA matches the aggressor RHR-RA, and if it does not, then sub-bank logic 216 may determine if the address Act-RA and RHR-RA are in a same sub-bank (e.g., is Act-RA in sub-bank B 206). If they are not, the sub-bank logic 216 provides a complimentary match signal matchF at an active level. If both the RHR command and matchF are active, then a logic circuit 220 may provide the RHR command to the sub-bank 206. A refresh address generator 222 provides one or more refresh addresses RXADD responsive to either a refresh command REF or the RHR command. If the RHR command is active, then the refresh address generator 222 may generate refresh address(es) based on RHR-RA. Responsive to the RHR command from logic circuit 220, a row decoder (not shown) may refresh one or more word lines associated with RXADD in the sub-bank 206.

The aggressor detector circuit 212 may detect aggressor addresses in the sub-bank 206 based on one or more criteria. For example, the aggressor detector circuit 212 may count accesses to different addresses and if an access count crosses a threshold may determine that address to be an aggressor. In some embodiments, the aggressor detector 212 may receive the accessed address Act-RA and use that to detect an aggressor. In some embodiments, the access counts may be stored in the memory array (e.g., along memory cells of the row associated with that memory count), and the aggressor detector may receive those counts when the row is accessed. Various other techniques to determine aggressor addresses may be used in other example embodiments. When the aggressor detector circuit 212 detects an aggressor it may activate a flag and provide the aggressor address as RHR-RA.

During an example access operation, a command decoder (e.g., 106 of FIG. 1) provides an activation signal ACT while an address decoder (e.g., 104 of FIG. 1) provides an accessed address Act-RA. The address Act-RA may be associated with a word line 204 in the first sub-bank. Responsive to the address Act-RA and the activation signal ACT, the word line 204 is accessed.

A comparator circuit 214 may receive the flag and the RHR-RA from the aggressor detector 212 as well as an accessed address Act-RA. If the flag is active (e.g., if there is a detected aggressor) then the comparator 214 may compare the address RHR-RA and Act-RA to determine if they are the same. If they are not the same, then a sub-bank logic circuit 216 may determine if the address Act-RA is in the sub-bank associated with the refresh control circuit 210. For example, the logic 216 may check a portion of the row address Act-RA which specifies a sub-bank to determine if the address Act-RA is associated with sub-bank B 206. IF the address is not associated with sub-bank B, then the logic 216 provides a signal matchF at an active level (e.g., at a high logical level).

A logic circuit 218 receives the activation command ACT (e.g., from a command decoder) and the flag signal from the aggressor detector 212. If the flag signal is active (e.g., if an aggressor has been detected) then the logic circuit may provide an RHR command. For example, the logic 218 may be an AND gate with inputs coupled to flag and to ACT. A second logic circuit 220 may provide the RHR command to the sub-bank (or to a row decoder associated with the sub-bank) when both the signal matchF and the RHR command are active. For example, the second logic circuit 220 may also be an AND gate with input terminals coupled to RHR from the first logic circuit 218 and to matchF from the sub-bank logic 216. If both are active, then the RHR command is provided to the sub-bank 206.

The refresh logic 210 includes a refresh address generator 222. The refresh address generator 222 includes a CBR counter circuit 224 which generates sequential refresh addresses as the refresh address RXADD when a refresh signal REF is active and a targeted refresh address generator 226 which generates a targeted refresh address as the refresh address RXADD when a targeted refresh signal RHR is active. Responsive to a refresh signal REF, the CBR counter circuit 224 may provide a refresh address RXADD as part of a sequential refresh operation. For example, the CBR counter circuit 224 may updates an address and provides it as the refresh address RXADD as part of a sequential refresh operation. For example, a previous sequential refresh address may be incremented by the CBR counter circuit 224 to generate a new sequential refresh address. In some embodiments, the refresh address generator 222 may provide multiple addresses and perform multiple sequential refresh operations responsive to the signal REF. In some embodiments, the refresh control circuit 210 may perform different numbers of sequential refresh operations responsive to activations of REF. For example, the refresh control circuit 210 may alternate between two sequential refresh operations and one sequential refresh operation.

The targeted refresh address generator 226 may provide a targeted refresh address RXADD based on the aggressor address RHR-RA when the signal RHR is provided. For example, the address RXADD may represent a word line which near to a word line associated with RHR-RA. For example the address RXADD may be one of the word lines adjacent to RHR-RA (e.g., RHR-RA+1 and RHR-RA−1). Other relationships may also be used. In some embodiments, the refresh address generator 222 may provide multiple refresh addresses RXADD responsive to the signal RHR (e.g., both RHR-RA+1 and RHR-RA−1).

Responsive to the signal RHR, a word line associated with RXADD is refreshed in the sub-bank 206. For example, a word line 208 may be refreshed. In this manner, a targeted refresh operation may be performed on the word line 208 in the second sub-bank 206 while the word line 204 in the first sub-bank 202 is being accessed. After refreshing the victim (s) of the identified aggressor RHR-RA, the aggressor detector 212 may reset the flag to an inactive (or unset) state.

Figure 2A:
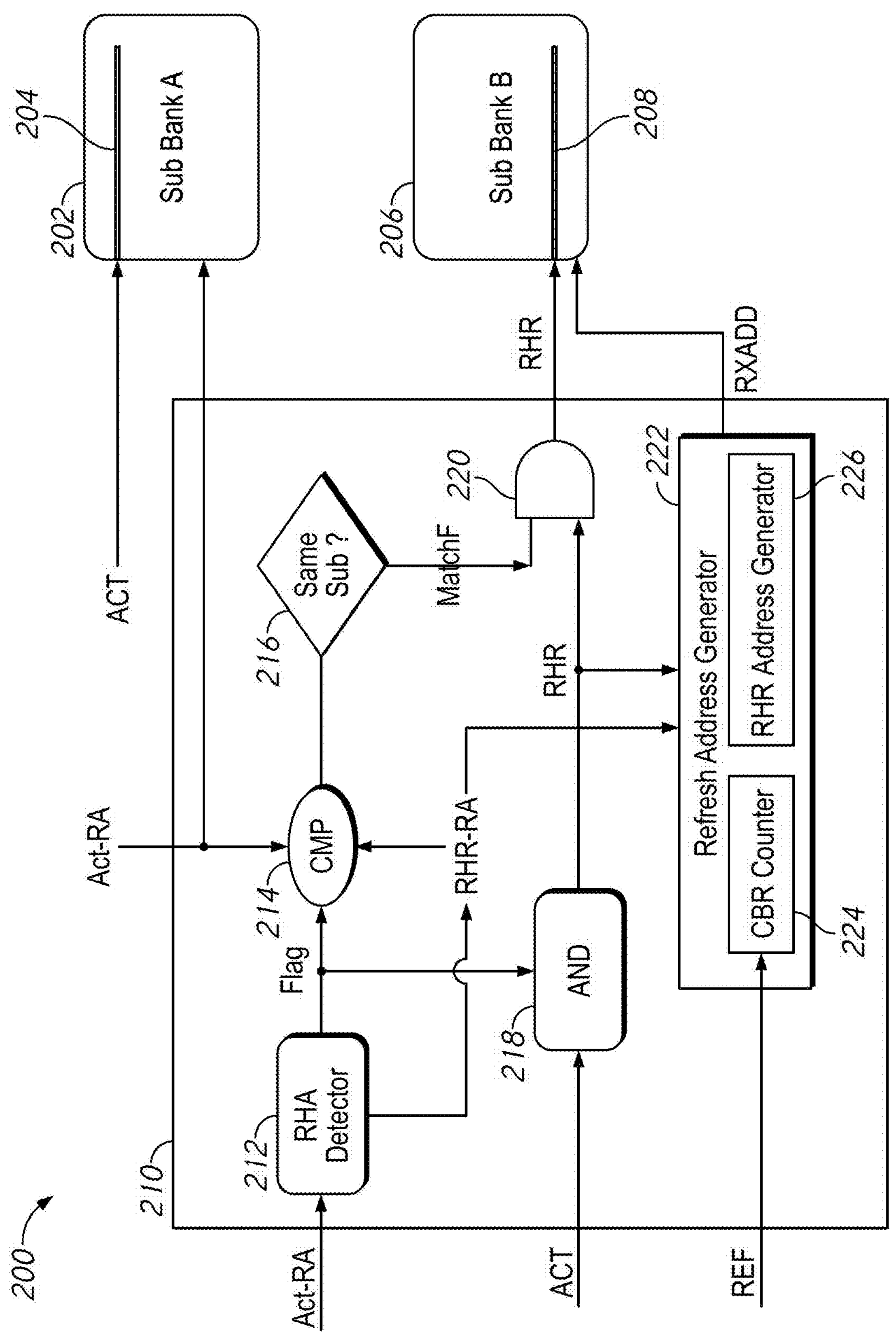
FIG. 2A is a block diagram of refresh logic according to some embodiments of the present disclosure.
Figure 2B:
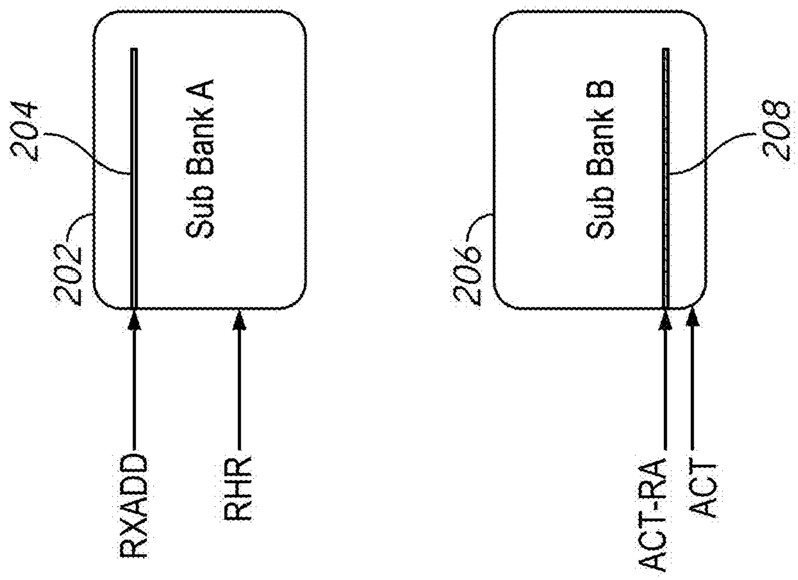
FIG. 2B is a block diagram of refresh operations according to some embodiments of the present disclosure.

FIG. 2B is a block diagram of refresh operations according to some embodiments of the present disclosure. FIG. 2A shows refresh logic performing a targeted refresh operation on a second sub-bank when an access operation is performed in a first sub-bank. FIG. 2B shows a subsequent operation which may be performed on the same sub-banks 202 and 206. For the sake of brevity the details of the refresh logic 210 shown in FIG. 2A are not repeated with respect to FIG. 2B. Each of the sub-banks 202 and 206 may be associated with refresh logic similar to the refresh logic 210 of FIG. 2A.

FIG. 2B shows a targeted refresh being performed on the first sub-bank 202 when an access is performed on the second sub-bank 206. For example, an address decoder (e.g., 104 of FIG. 1) may provide an access address ACT-RA, while a command decoder (e.g., 106 of FIG. 1) provides a row activation command ACT. In the situation depicted in FIG. 2B, the address ACT-RA is associated with a word line 208 in a second sub-bank 206. A refresh logic circuit (not shown) associated with the first sub-bank 202 also receives the signals ACT and ACT-RA. Based on a determination that the address ACT-RA is associated with the second sub-bank 206 (and a previous identification of an aggressor in the first sub-bank 202), a refresh address RXADD and refresh signal RHR may be generated. In this manner, a word line 204 in the first sub-bank 202 may be refreshed responsive to a word line 208 in the second sub-bank being accessed.

Figure 3:
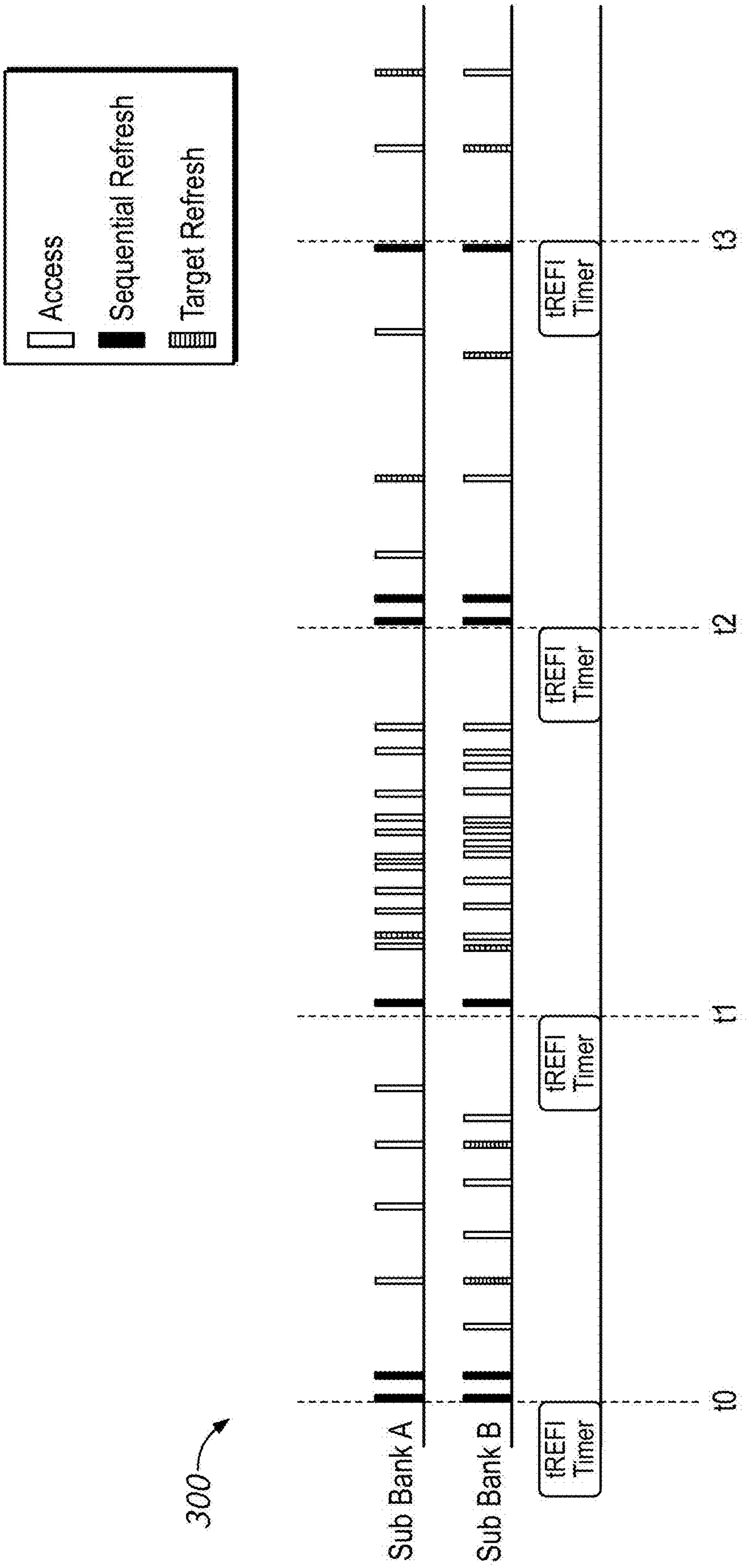
FIG. 3 is a timing diagram of refresh operations in a memory according to some embodiments of the present disclosure.

FIG. 3 is a timing diagram of refresh operations in a memory according to some embodiments of the present disclosure. The timing diagram 300 may represent refresh operations in a device such as the memory device 100 of FIG. 1 and/or the refresh logic 200 of FIG. 2.

The timing diagram shows several refresh intervals, beginning at times t0, t1, t2, and t3, each of which is marked by the activation of tREFI timer signal. The different refresh intervals may be separated by a time tREFI, which may be a setting of the memory. In some embodiments, the refresh intervals may be marked by a refresh signal REF (not shown in FIG. 3).

During the first refresh interval beginning at t0, a refresh signal causes two sequential refresh operations to be performed in both sub-banks. Before the time t0, an aggressor address has been detected in sub-bank B, but not in sub-bank A. After t0, a first access is performed in sub-bank B. Since there is no detected aggressor in sub-bank A (e.g., the flag for sub-bank A is inactive/unset), no targeted refresh is performed in sub-bank A responsive to the access in sub-bank B. However, when a row is accessed in sub-bank A, a targeted refresh operation may be performed in sub-bank B. During subsequent accesses to sub-bank B, a second aggressor may be detected. Accordingly, during a later access to sub-bank A, a second targeted refresh may be performed in sub-bank A.

During a second refresh interval beginning at t1, only a single sequential refresh operation may be performed. At the time t1, aggressors have been located in both of the sub-banks. Accordingly, after a first access in the first sub-bank, a targeted refresh is performed in sub-bank B. After a first access in the sub-bank B, a targeted refresh is performed in the sub-bank A. Since no further aggressors are detected in the period between t1 and t2, no further targeted refresh operations are performed.

During a third refresh interval beginning at t2, two sequential refresh operations are performed. After that, an access is performed in the sub-bank A, which is determined to be an aggressor. Accordingly, a next time sub-bank B is accessed, a targeted refresh operation is performed in sub-bank A. Similarly at the refresh period beginning with t3, targeted refresh operations are performed in both sub-banks responsive to access operations in the opposite sub-bank.

Figure 4:
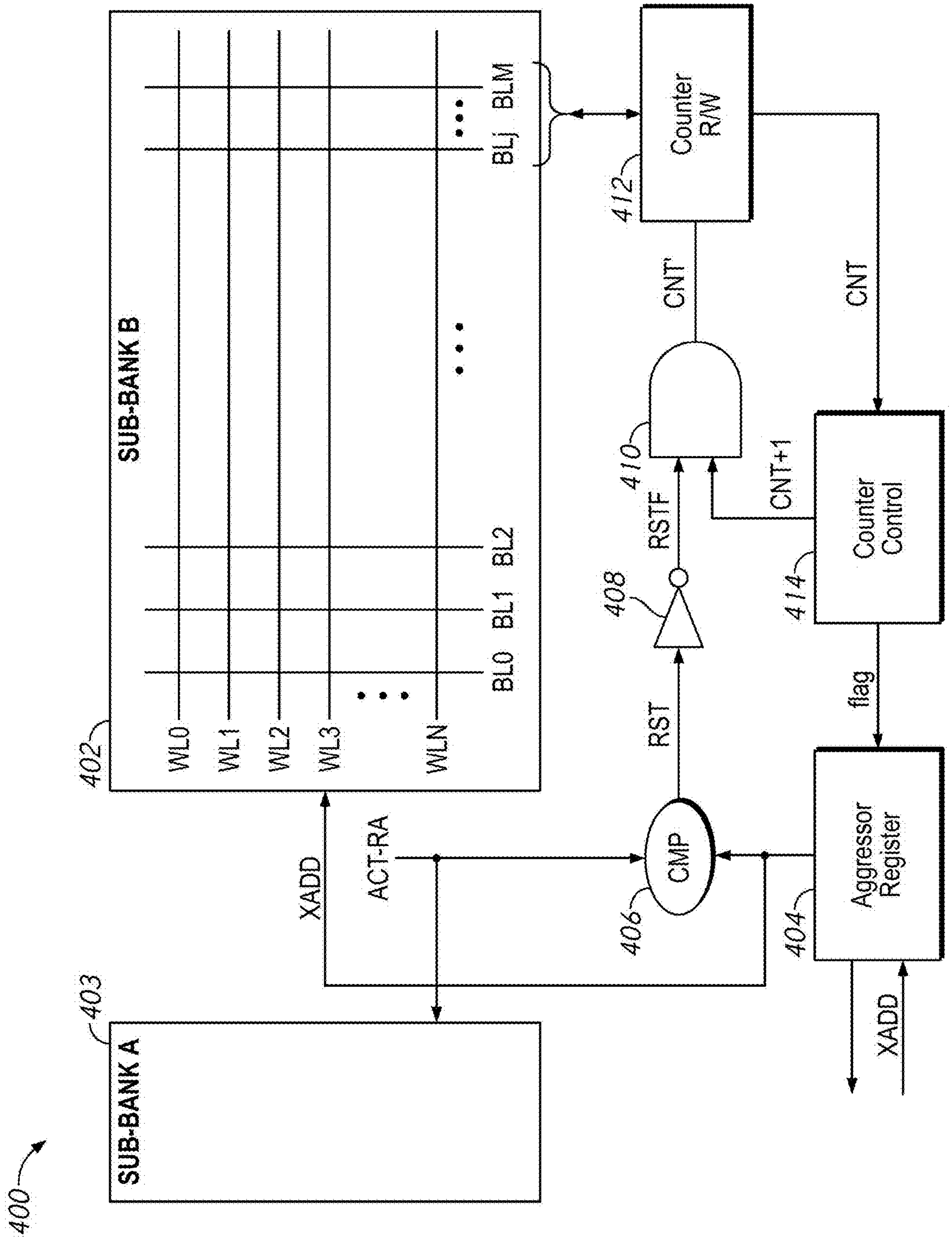
FIG. 4 is a block diagram of refresh logic according to some embodiments of the present disclosure.

FIG. 4 is a block diagram of refresh logic according to some embodiments of the present disclosure. FIG. 4 shows refresh logic which may be included in the memory device 100 of FIG. 1, and which may implement a portion of the refresh logic 200 of FIG. 2. FIG. 4 shows a sub-bank 402 (e.g., 206 of FIGS. 2A-B) as well as a sub-bank 403 (e.g., 202 of FIGS. 2A-B) and several other components which may be part of a refresh control circuit (e.g., 210 of FIGS. 2A-B).

FIG. 4 shows an example embodiment where access counts used to determine if a row is an aggressor are stored along the rows of the memory array. When that row is accessed, the count may be read out from the word line, changed (e.g., incremented), and compared to a threshold. If it meets or exceeds a threshold it may be judged to be an aggressor, and an aggressor flag (e.g., flag of FIG. 2A) may be set. Responsive to the flag being set, the aggressor address XADD may be stored in an aggressor register (which may be a component of the refresh control circuit 210 of FIG. 2A) and the count value of that row address XADD may be reset. In the embodiment of FIG. 4, the refresh logic 400 may reset the aggressor count performing the targeted refresh responsive to an access in the other sub-bank 403 of the memory.

The refresh logic 400 shows a sub-bank 402 which includes a number of word lines and bit lines. Memory cells (not shown) are located at the intersection of the word and bit lines. Certain memory cells along each row are set aside to store a count value associated with that row. In the example embodiment of FIG. 4, bit lines along the end of word line, the bit line BLj to BLm are used, however other placements may be used in other values. The memory cells at the intersection of the bit lines BLj to BLm with each word line may store a binary number which represents a count of accesses to that word line. The sub-bank 403 may also have a similar structure (e.g., bit lines, word lines, memory cells, count values in memory cells, etc.) but for clarity they are not shown in FIG. 4.

When a word line is accessed (e.g., responsive to the access address ACT-RA and an activation signal ACT), the count value CNT associated with that row may be read out by a counter read/write (R/W) circuit 412. A counter control circuit 414 (which may be part of an aggressor detector circuit such as 212 of FIG. 2) may change the count value. In the example of FIG. 4, the counter control circuit 414 may increment the count (e.g., to CNT+1). The count control circuit 414 compares the updated count value to a threshold. If the updated count value meets or exceeds the threshold, the counter control circuit 414 may set a flag signal (e.g., change the signal flag from logical low to logical high) which indicates that the address ACT-RA is an aggressor.

The changed count value CNT+1 is provided to a logic gate 410, which provides it as a new count value CNT' to the counter R/W circuit 412 when a reset signal RSTF is at a high logical level. Responsive to receiving an updated count value, the counter R/W circuit 412 writes the updated value CNT' back to the memory cells of the sub-bank 402.

An aggressor register 404 (e.g., part of a refresh address generator 222 of FIG. 2) receives the flag signal flag and responsive to the signal flag being set (e.g., being changed to an active state) the aggressor register 404 captures a current value of the address XADD along the row address bus. The address XADD may be the address ACT-RA which was accessed and which associated count value crossed the threshold.

A comparator 406 may receive an activation address ACT-RA as part of a subsequent access operation. The comparator 406 compares the address ACT-RA and the stored aggressor address XADD in the aggressor register 404 and determines if they are in the same sub-bank. If they are not (e.g., if ACT-RA is associated with sub-bank 403), then the comparator 406 provides a reset signal RST at an active level. An inverter 408 provides the signal RSTF at a low logical level when the signal RST is at an active level. When the signal RSTF is at a low logical level, the logic gate 410 provides a value of CNT' which is a reset value. For example, the logic gate 410 may be AND logic, and when the signal RSTF is at a low logical level, the bits of the value CNT' may be at a low logical level (e.g., the binary number may be 0). Accordingly, when the aggressor register 404 stores an aggressor address XADD in a sub-bank 402, and a subsequent access address is provided associated with a second sub-bank 403, then a reset count value CNT' is written to the memory cells which store the count along a word line associated with RST-RA (e.g., the aggressor word line). In some embodiments, the comparator 406 may be the same comparison logic used to determine if the aggressor and accessed address are in the same sub-bank (e.g., the comparator 406 may represent the comparator 214 and sub-bank logic 216 of FIG. 2).

Figure 5:
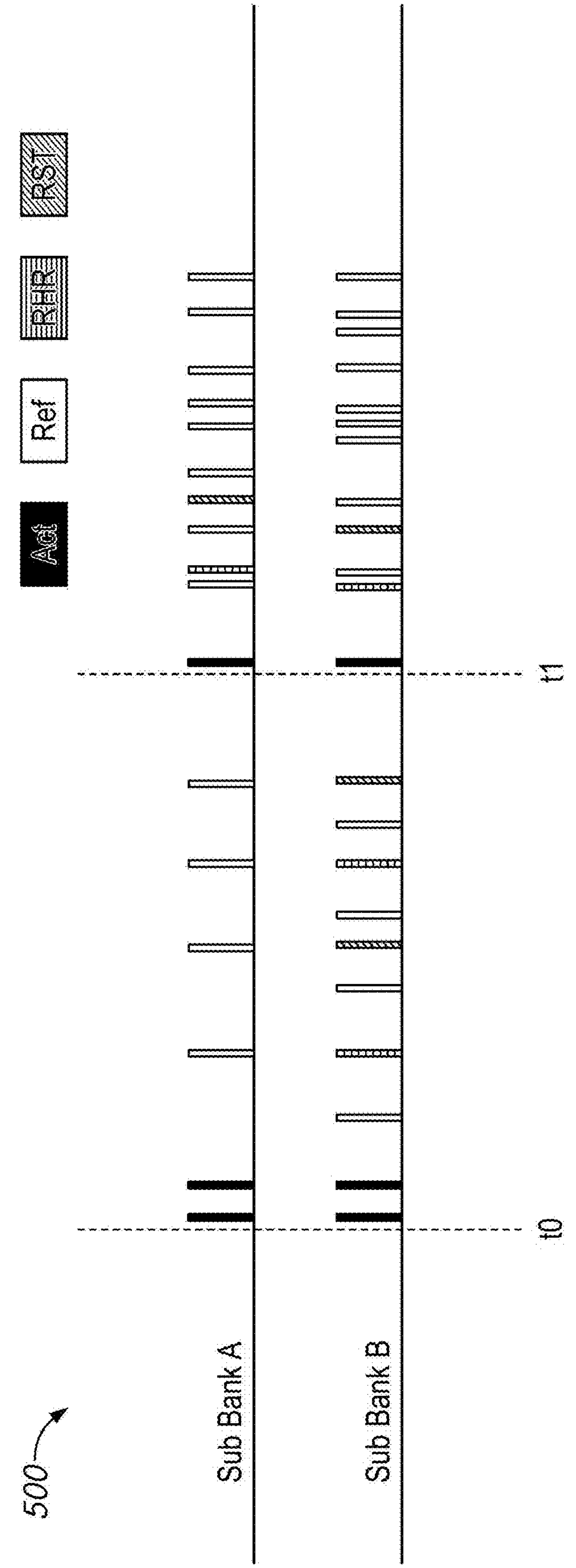
FIG. 5 is a timing diagram of refresh operations according to some embodiments of the present disclosure.

FIG. 5 is a timing diagram of refresh operations according to some embodiments of the present disclosure. The timing diagram 500 may, in some embodiments, represent the operations of refresh logic such as the refresh logic 400 of FIG. 4. The timing diagram 500 may be generally similar to the timing diagram 300 of FIG. 3. For the sake of brevity, features previously described with respect to FIG. 3 will not be described again.

At an initial time t0, a refresh period begins with two sequential refresh operations. Afterwards, an access is performed in sub-bank B, and the access address is identified as an aggressor. When a word line in sub-bank A is performed, a targeted refresh is performed on a victim associated with the aggressor. For the sake of simplicity, in the example of FIG. 5, only a single targeted refresh is performed per aggressor. During a next access in the sub-bank A, the aggressor is accessed so that its count value may be reset as part of a reset operation.

At a first time t1, an aggressor is detected in both sub-banks. During a first access to sub-bank A, a targeted refresh is performed in sub-bank B. Next during an access to sub-bank B a targeted refresh is performed in sub-bank A. Next, sub-bank A is accessed and the aggressor in sub-bank B is reset followed by an access to sub-bank B which allows a reset operation to be performed on the aggressor in sub-bank A.

Figure 6:
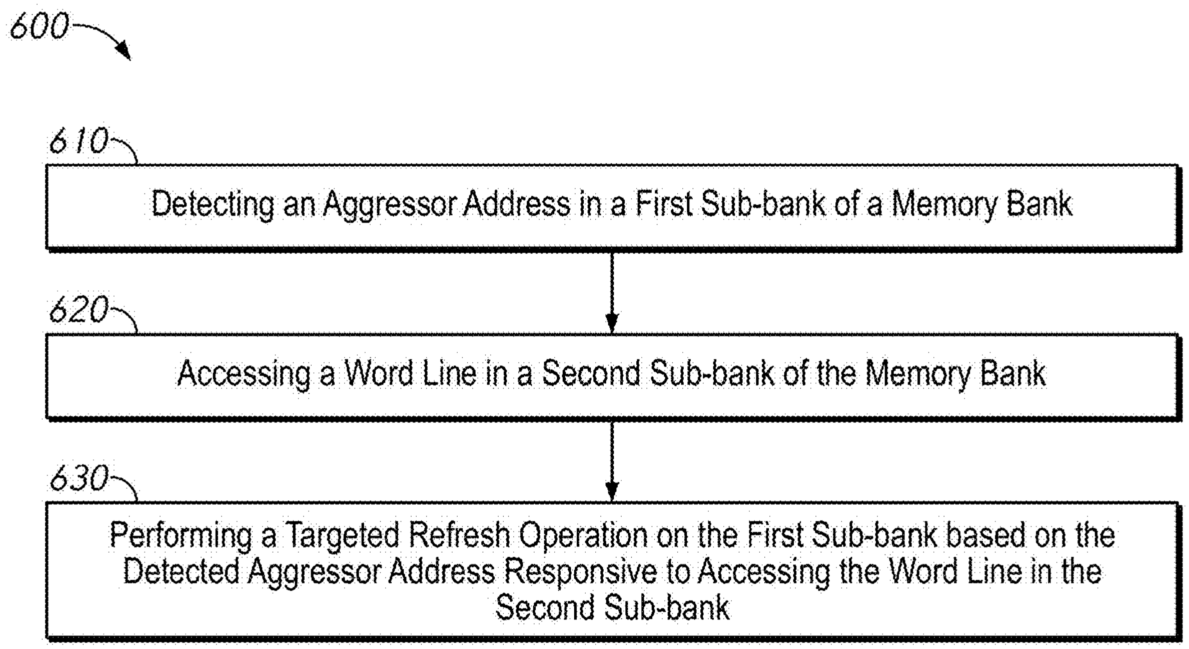
FIG. 6 is a flow chart of a method according to some embodiments of the present disclosure.

FIG. 6 is a flow chart of a method according to some embodiments of the present disclosure. The method 600 may, in some embodiments, be implemented by one or more of the apparatuses or components thereof described herein, such as the memory device 100 of FIG. 1, the refresh logic 200 of FIG. 2 and/or the refresh logic 400 of FIG. 4.

The method 600 includes block 610, which describes detecting an aggressor address in a first sub-bank of a memory bank. For example, the method 600 may include detecting the aggressor address with an aggressor detector 212 based on accesses to the aggressor address. For example, the method 600 may include counting accesses to accessed addresses and designating an address as the aggressor address when its count meets or exceeds a threshold. In some embodiments, the method 600 may include reading a count value from memory cells of a word line associated with the aggressor address and determining that it's the aggressor based on the count value.

The method 600 includes box 620, which describes accessing a word line in a second sub-bank of the memory bank. For example, an access address ACT-RA may be associated with a word line in the second sub-bank.

The method 600 includes box 630, which describes performing a targeted refresh operation on the first sub-bank based on the detected aggressor address responsive to accessing the word line in the second sub-bank. For example, the method 600 may include generating a refresh address based on the aggressor address and refreshing a word line associated with the refresh address as part of a targeted refresh operation. The method 600 may include performing the targeted refresh operation on the first sub-bank responsive to a next access operation in the second sub-bank after detecting the aggressor address in the first sub-bank. The method 600 may also include performing sequential refresh operations based on a refresh signal which periodically provided.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

a row hammer detector configured to detect an aggressor address and set a row hammer flag when the aggressor address is detected;

a comparator configured to compare the aggressor address to an accessed address and provide an active match signal when the aggressor address and the accessed address are in different sub-banks; and a logic circuit configured to provide a targeted refresh command responsive to an access command when the match signal is active.

2. The apparatus of claim 1, further comprising a refresh address generator configured to provide a refresh address based on the aggressor address responsive to the targeted refresh command.

3. The apparatus of claim 1, further comprising:

a counter read/write circuit configured to receive a count value from a memory array, wherein the row hammer detector is configured to detect the aggressor address based on the count value.

4. The apparatus of claim 3, wherein the count value is stored in memory cells of a row associated with the count value.

5. The apparatus of claim 3, wherein the row hammer detector is further configured to:

change the count value and compare the changed count value to a threshold; and responsive to the changed count value meeting or exceeding the threshold, provide the updated count value to the counter read/write circuit, and wherein the counter read/write circuit is further configured to write the updated count value to the memory array.

6. The apparatus of claim 3, further comprising:

a refresh address generator circuit configured to provide a reset address after the targeted refresh command, wherein the comparator is configured to provide a reset signal when the accessed address is not in the same sub-bank as the reset address, and wherein the counter read/write circuit is further configured to reset the count value responsive to the reset signal.

7. The apparatus of claim 1, further comprising a memory bank including a first sub-bank and a second sub-bank, wherein the accessed address is associated with the first sub-bank and the aggressor address is associated with the second sub-bank.

8. The apparatus of claim 7, wherein responsive to the accessed address a first word line is accessed in the first sub-bank while responsive to the targeted refresh command a word line is refreshed in the second sub-bank.

9. A method comprising:

detecting an aggressor address and setting a row hammer flag when the aggressor address is detected;

comparing the aggressor address to an accessed address and providing an active match signal when the aggressor address and the accessed address are in different sub-banks; and providing a targeted refresh command responsive to an access command when the match signal is active.

10. The method of claim 9, further comprising:

providing a refresh address based on the aggressor address responsive to the targeted refresh command.

11. The method of claim 9, further comprising:

detecting the aggressor address based on a count value provided by a memory array.

12. The method of claim 11, further comprising:

changing the count value and comparing the changed count value to a threshold; and responsive to the changed count value meeting or exceeding the threshold, providing the updated count value to the memory array.

13. The method of claim 11, further comprising:

providing a reset address after the targeted refresh command;

providing a reset signal when the accessed address is not in the same sub-bank as the reset address, and resetting the count value responsive to the reset signal.

14. The method of claim 9, wherein the accessed address is associated with a first sub-bank of a memory bank and the aggressor address is associated with a second sub-bank of the memory bank.

15. The method of claim 14, wherein responsive to the accessed address a first word line is accessed in the first sub-bank while responsive to the targeted refresh command a word line is refreshed in the second sub-bank.

16. An apparatus comprising:

an aggressor detector circuit configured to activate a flag responsive to detecting an aggressor address in a sub-bank and provide the aggressor address;

a comparator configured to determine if an accessed address matches the aggressor address and issue an active match signal when the aggressor address and the accessed address are in different sub-banks;

a logic circuit configured to provide a targeted refresh signal to the sub-bank responsive to the activated flag; and a refresh address generator configured to provide a refresh address based on a refresh signal or the targeted refresh signal.

17. The apparatus of claim 16, further comprising a row decoder configured to refresh one or more word lines of the sub-bank based on the refresh address.

18. The apparatus of claim 16, wherein the refresh address generator comprises:

a counter circuit configured to generate sequential refresh addresses as the refresh address when the refresh signal is active; and a targeted refresh address generator configured to generate a targeted refresh address as the refresh address when the targeted refresh signal is active.

19. The apparatus of claim 18, wherein the sequential refresh addresses are part of a sequential refresh operation on the sub-bank with timing based on a refresh interval.

20. The apparatus of claim 19, wherein aggressor detector circuit is configured to identify the aggressor address based on a count value read from memory cells of the aggressor address.

* * * * *